United States Patent
Sun

(10) Patent No.: US 12,519,466 B2
(45) Date of Patent: Jan. 6, 2026

(54) DUAL VOLTAGE LEVEL BOOTSTRAP SWITCH

(71) Applicant: QUALCOMM Incorporated, San Diego, CA (US)

(72) Inventor: Lei Sun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 7 days.

(21) Appl. No.: 18/647,205

(22) Filed: Apr. 26, 2024

(65) Prior Publication Data

US 2025/0337408 A1    Oct. 30, 2025

(51) Int. Cl.
*H03K 17/30* (2006.01)
*H03K 17/0412* (2006.01)
*H03K 19/0185* (2006.01)
*H03K 19/0948* (2006.01)

(52) U.S. Cl.
CPC ..... *H03K 17/302* (2013.01); *H03K 17/04123* (2013.01); *H03K 19/018521* (2013.01); *H03K 19/0948* (2013.01)

(58) Field of Classification Search
CPC ........... H03K 17/302; H03K 17/04123; H03K 19/018521; H03K 19/0948; H03K 17/06; H03K 17/063; H03K 19/01714; H03K 19/01; H03K 19/017; H03K 19/01707; H03K 19/01728; H03K 19/01735
See application file for complete search history.

(56) References Cited

U.S. PATENT DOCUMENTS 11,606,030 B1 *    3/2023    Kruiskamp ...... H03K 17/04123

\* cited by examiner

*Primary Examiner* — Jung Kim
(74) *Attorney, Agent, or Firm* — Loza & Loza, LLP

(57) ABSTRACT

A boost circuit includes a first p-type field effect transistor (PFET), a second PFET, a first capacitor, and a second capacitor. A drain of the first PFET and a drain of the second PFET are coupled to a supply rail in a first voltage domain, a gate of the first PFET is coupled to a source of the second PFET, and a gate of the second PFET is coupled to a source of the first PFET. A first terminal of the first capacitor is coupled to the source of the first PFET and a first terminal of the second capacitor is coupled to the source of the second PFET. A second terminal of the first capacitor and a second terminal of the second capacitor are driven by a first control signal and a second control signal, respectively, in a second voltage domain.

16 Claims, 12 Drawing Sheets

DUAL VOLTAGE LEVEL BOOTSTRAP SWITCH

BACKGROUND

Field

Aspects of the present disclosure relate generally to switches, and, more particularly, to bootstrap switches.

Background

A transistor may be used as a switch for selectively blocking or passing a signal in a signal path. A challenge with using a transistor as a switch is that the on resistance of the transistor depends on the gate-to-source voltage of the transistor. This dependance causes the on resistance of the transistor to vary when the voltage of the signal varies, which distorts the signal. To overcome the voltage-dependent on resistance of the transistor, a bootstrap circuit may be used to drive the gate of the transistor. The bootstrap circuit (also referred to as a bootstrap switch) is coupled to the gate of the transistor, and generates a gate voltage that tracks the voltage of the signal. By tracking the voltage of the signal, the bootstrap circuit causes the gate-to-source voltage of the transistor to be approximately constant, and therefore the on resistance to be approximately constant for good linearity.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a boost circuit. The boost circuit includes a first p-type field effect transistor (PFET), wherein a drain of the first PFET is coupled to a supply rail in a first voltage domain, and a second PFET, wherein a drain of the second PFET is coupled to the supply rail in the first voltage domain, a gate of the second PFET is coupled to a source of the first PFET, and a gate of the first PFET is coupled to a source of the second PFET. The boost circuit also includes a first capacitor, wherein a first terminal of the first capacitor is coupled to the source of the first PFET, and a second capacitor, wherein a first terminal of the second capacitor is coupled to the source of the second PFET. The system also includes a control signal generator powered in a second voltage domain, wherein the control signal generator is configured to generate a first control signal and a second control signal, output the first control signal to a second terminal of the first capacitor, and output the second control signal to a second terminal of the second capacitor. The system also includes one or more PFETs, wherein a gate of each of the one or more PFETs is coupled to the first terminal of the first capacitor or the first terminal of the second capacitor.

A second aspect relates to a method for operating a system. The system includes first p-type field effect transistor (PFET), a second PFET, a first capacitor, and a second capacitor, wherein a drain of the first PFET and a drain of the second PFET are coupled to a supply rail in a first voltage domain, a gate of the first PFET is coupled to a source of the second PFET, a gate of the second PFET is coupled to a source of the first PFET, a first terminal of the first capacitor is coupled to the source of the first PFET, and a first terminal of the second capacitor is coupled to the source of the second PFET. The method includes receiving a first control signal and a second control signal in a second voltage domain, driving a second terminal of the first capacitor with the first control signal, driving a second terminal of the second capacitor with the second control signal, and driving a gate of each of one or more PFETs with a boosted control signal from the first terminal of the first capacitor or the first terminal of the second capacitor.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A switch transistor may be used in a signal path to selectively block or pass a signal in the signal path. As used herein, a "switch transistor" is a transistor that is used as a switch. A switch transistor may be implemented with an n-type field effect transistor (NFET) or another type of transistor. The on/off state of a switch transistor may be controlled by controlling the voltage at the gate of the switch transistor. For the example of a switch transistor implemented with an NFET, the switch transistor may be turned on by applying a high voltage to the gate of the switch transistor, and the switch transistor may be turned off by applying a low voltage to the gate of the switch transistor. The switch transistor has an on resistance, which is the resistance across the switch transistor when the switch transistor is turned on (i.e., switched on).

A challenge with using a switch transistor to selectively pass or block a signal in a signal path is that the on resistance of the switch transistor depends on the gate-to-source voltage of the switch transistor. This dependance causes the on resistance of the switch transistor to vary when the voltage of the signal in the signal path varies. The varying on resistance of the switch transistor causes distortions in the signal in the signal path.

Figure 1:
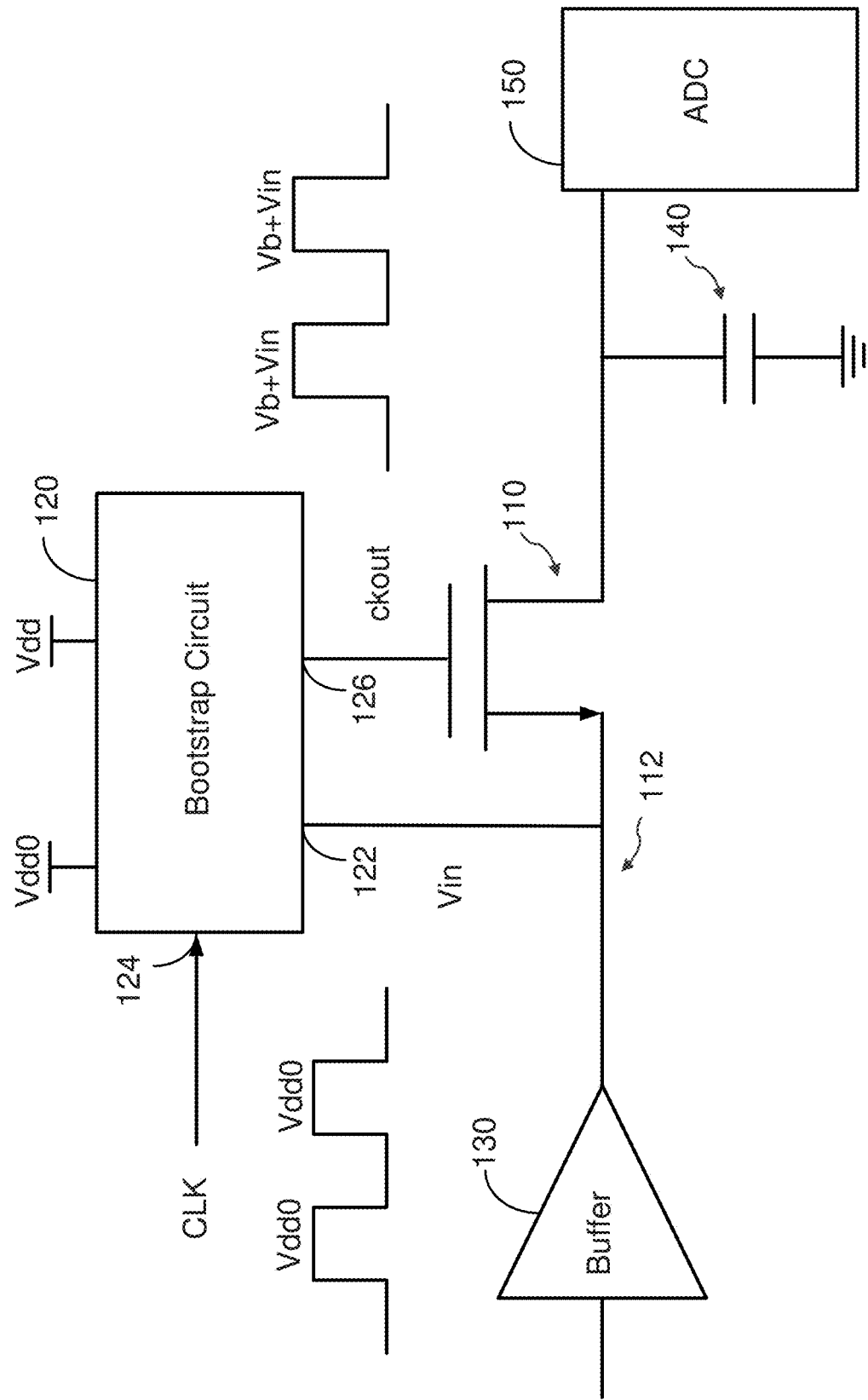
FIG. 1 shows an example of a bootstrap circuit and a switch transistor according to certain aspects of the present disclosure.

To address the voltage-dependent on resistance of the switch transistor, a bootstrap circuit may be used to drive the gate of the switch transistor. In this regard, FIG. 1 shows an example of a switch transistor 110 and a bootstrap circuit 120 according to certain aspects. In the example in FIG. 1, the switch transistor 110 is implemented with an NFET. However, it is to be appreciated that the switch transistor 110 may be implemented with another type of transistor such as a p-type field effect transistor (PFET).

The switch transistor 110 is used to selectively pass or block a signal in a signal path 112. In the example in FIG. 1, the signal path 112 is between the output of a buffer 130 and a sampling capacitor 140. The buffer 130 (e.g., an amplifier) is configured to drive the signal path 112 with the signal. The sampling capacitor 140 may be used with an analog-to-digital converter (ADC), a capacitive digital-to-analog converter (DAC), or another type of circuit to sample the signal (e.g., sample the voltage of the signal). However, it is to be appreciated that the disclosure is not limited to these examples. It is also to be appreciated that the sampling capacitor 140 may be implemented with multiple capacitors (e.g., multiple capacitors coupled in parallel) in some implementations.

The bootstrap circuit 120 is configured to switch the switch transistor 110 on and off based on a clock signal CLK. The bootstrap circuit 120 has an input 122 coupled to a terminal (e.g., a source) of the switch transistor 110, a clock input 124 configured to receive the clock signal CLK, and an output 126 coupled to the gate of the switch transistor 110. As used herein, a "clock signal" is a periodic signal that alternates between a first voltage (e.g., ground potential) and a second voltage (e.g., a supply voltage) at an approximately constant frequency.

In certain aspects, the bootstrap circuit 120 operates in a first voltage domain having a first supply voltage Vdd while the clock signal CLK is generated in a second voltage domain having a second supply voltage Vdd0 that is lower than the first supply voltage Vdd (i.e., Vdd0<Vdd). For example, the bootstrap circuit 120 may operate in the higher voltage domain (i.e., the first voltage domain) to achieve higher linearity for a large signal swing. The clock signal CLK may be generated in the lower voltage domain (i.e., the second voltage domain) to save power. In this example, the clock signal CLK may have an amplitude equal to the second supply voltage Vdd0, as shown in the example in FIG. 1. In certain aspects, a portion of the bootstrap circuit 120 may also operate in the second voltage domain, as discussed further below. A voltage domain may also be referred to as a power domain or another term.

In operation, the bootstrap circuit 120 is configured to receive the voltage Vin of the signal at the terminal (e.g., the source) of the switch transistor 110, generate an output clock signal ckout based on the clock signal CLK and the voltage Vin, and output the output clock signal ckout to the gate of the switch transistor 110 to switch the switch transistor 110 on and off. The output clock signal ckout may have a period approximately equal to a period of the clock signal CLK. The output clock signal ckout has an amplitude approximately equal to Vb+Vin where Vb is a boost voltage. Thus, the output clock signal ckout boosts the voltage Vin by the boost voltage Vb when the output clock signal ckout is high. This assumes that the bootstrap circuit 120 has a boost efficiency of approximately one. In practice, the boost efficiency may be slightly less than one. The output clock signal ckout may have a voltage approximately equal to ground potential when the output clock signal ckout is low. In certain aspects, the boost voltage is equal to the first supply voltage Vdd (i.e., Vb=Vdd), but is not limited to this example.

Thus, the voltage at the gate of the switch transistor 110 is equal to Vb+Vin (e.g., Vdd+Vin) and the voltage at the source of the switch transistor 110 is equal to Vin when the output clock signal ckout is high. This causes the gate-to-source voltage VGS of the switch transistor 110 to be approximately constant at Vb (i.e., VGS=Vb+Vin−Vin, which simplifies to Vb). The constant gate-to-source voltage causes the on resistance of the switch transistor 110 to be approximately constant for good linearity. In this example, the switch transistor 110 is turned on during high phases of the output clock signal ckout (i.e., when the output clock signal ckout is high), and turned off during low phases of the output clock signal ckout (i.e., when the output clock signal ckout is low).

As discussed above, the sampling capacitor 140 may be used with an ADC. In this regard, FIG. 1 shows an example where the switch transistor 110 is coupled between the buffer 130 and an ADC 150. In this example, the sampling capacitor 140 samples the voltage of the signal in the signal path 112 when the first switch transistor 110 is turned on by the output clock signal ckout. When the first switch transistor 110 is turned off by the output clock signal ckout, the sampling capacitor 140 holds the sampled voltage of the signal, and the ADC 150 converts the sampled voltage into a digital signal (e.g., a digital code).

Figure 2A:
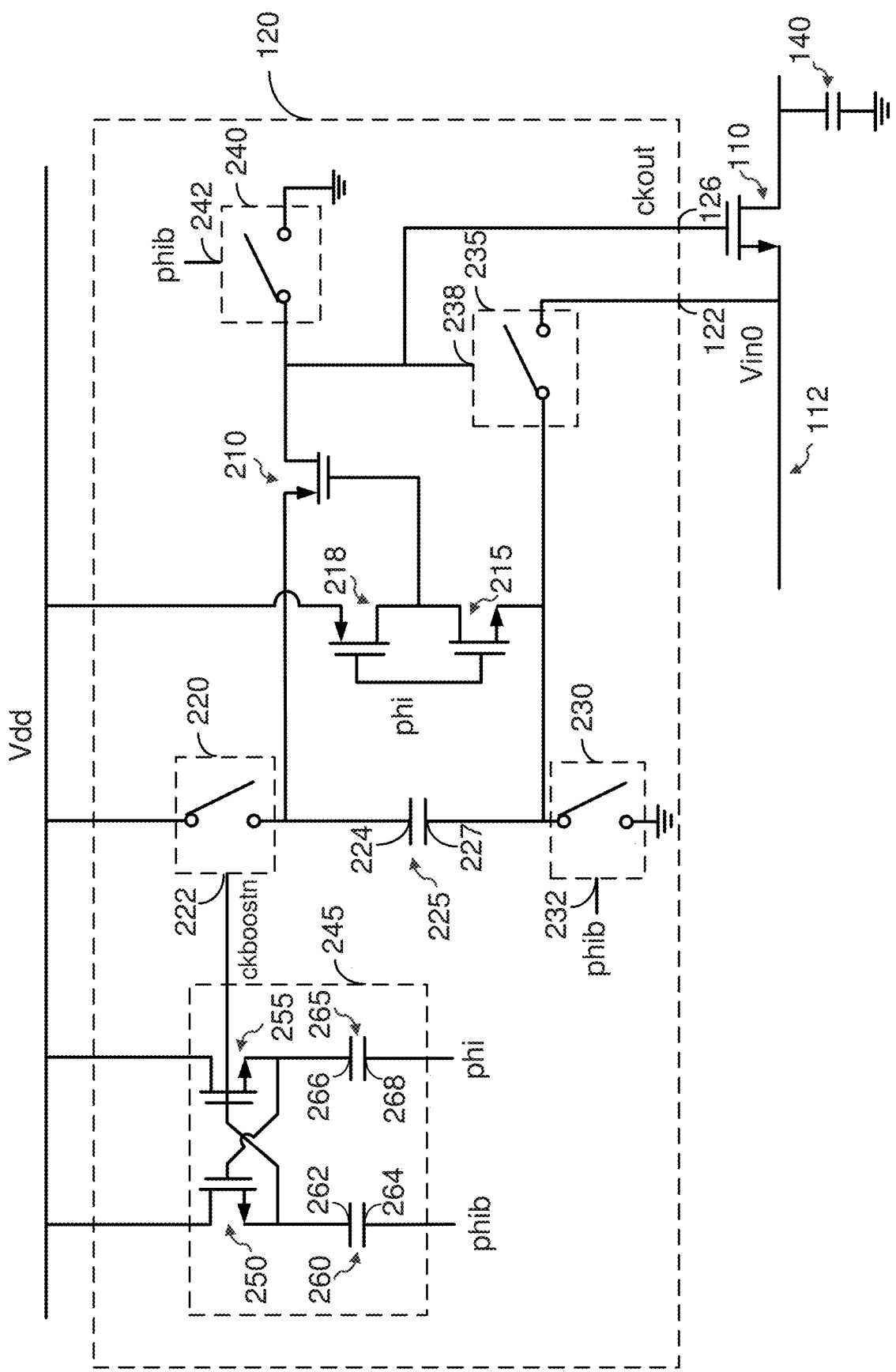
FIG. 2A shows an exemplary implementation of a bootstrap circuit according to certain aspects of the present disclosure.

FIG. 2A shows an exemplary implementation of the bootstrap circuit 120 according to certain aspects. In this example, the bootstrap circuit 120 includes a boost capacitor 225, a first switch 220, a second switch 230, a third switch 235, and a fourth switch 240. Each of the switches 220, 230, 235, and 240 has a respective control input 222, 232, 238, and 242 for controlling the on/off state of the switch. As used herein, a "control input" of a switch is an input that controls the on/off state of the switch based on a signal (e.g., voltage) applied to the input. Each of the switches 220, 230, 235, and 240 may be implemented with one or more respective transistors. As discussed further below, the on/off states of the switches 230 and 240 are controlled by control signal phib generated from the clock signal CLK.

In this example, the first switch 220 is coupled between a first terminal 224 of the boost capacitor 225 and a supply rail providing the first supply voltage Vdd. The second switch 230 is coupled between a second terminal 227 of the boost capacitor 225 and ground. A terminal of a capacitor may also be referred to as a plate, an electrode, or another term. The third switch 235 is coupled between the second terminal 227 of the boost capacitor 225 and the input 122 of the bootstrap circuit 120. The control input 238 of the third switch 235 is coupled to the output 126 of the bootstrap circuit 120. The fourth switch 240 is coupled between the output 126 of the bootstrap circuit 120 and ground.

The bootstrap circuit 120 also includes a transistor 210 coupled between the first terminal 224 of the boost capacitor 225 and the output 126 of the bootstrap circuit 120. In this example, the source of the transistor 210 is coupled to the first terminal 224 of the boost capacitor 225, and the drain of the transistor 210 is coupled to the output 126 of the bootstrap circuit 120. In the example shown in FIG. 2A, the transistor 210 is implemented with a p-type field effect transistor (PFET). However, it is to be appreciated that the transistor 210 may be implemented with another type of transistor.

The bootstrap circuit 120 also includes a transistor 215 coupled between the gate of the transistor 210 and the second terminal 227 of the boost capacitor 225. In this example, the drain of the transistor 215 is coupled to the gate of the transistor 210, and the source of the transistor 215 is coupled to the second terminal 227 of the boost capacitor 225. The bootstrap circuit 120 also includes a transistor 218 coupled between the gate of the transistor 210 and the supply rail for Vdd. In this example, the source of the transistor 218 is coupled to the supply rail, the drain of the transistor 218 is coupled to the gate of the transistor 210, and the gate of the transistor 218 is coupled to the gate of the transistor 215. The gates of the transistors 218 and 215 are driven by control signal phi generated from the clock signal CLK, as discussed further below.

In the example shown in FIG. 2A, the transistor 215 is implemented with an n-type field effect transistor (NFET) and the transistor 218 is implemented with a PFET. However, it is to be appreciated that the present disclosure is not limited to this example.

The bootstrap circuit 120 also includes a boost circuit 245 coupled to the control input 222 of the first switch 220. As discussed further below, the boost circuit 245 is configured to generate a boosted control signal ckboostn used to control the on/off state of the first switch 220 (e.g., NFET). The voltage of the control signal ckboostn swings between 2 Vdd and Vdd (assuming a boost efficiency of approximately one). Thus, in this example, the control signal ckboostn has a high voltage of 2 Vdd and a low voltage of Vdd. In this example, the boost circuit 245 may also be referred to as a voltage doubler or another term.

In the example in FIG. 2A, the boost circuit 245 includes a first transistor 250 (e.g., first NFET), a second transistor 255 (e.g., second NFET), a first capacitor 260, and a second capacitor 265. The drains of the first transistor 250 and the second transistor 255 are coupled to the supply rail. The first transistor 250 and the second transistor 255 are cross-coupled in which the gate of the first transistor 250 is coupled to the source of the second transistor 255 and the gate of the second transistor 255 is coupled to the source of the first transistor 250. The first capacitor 260 has a first terminal 262 coupled to the source of the first transistor 250 and a second terminal 264 driven by the control signal phib. The second capacitor 265 has a first terminal 266 coupled to the source of the second transistor 255 and a second terminal 268 driven by the control signal phi.

Figure 2B:
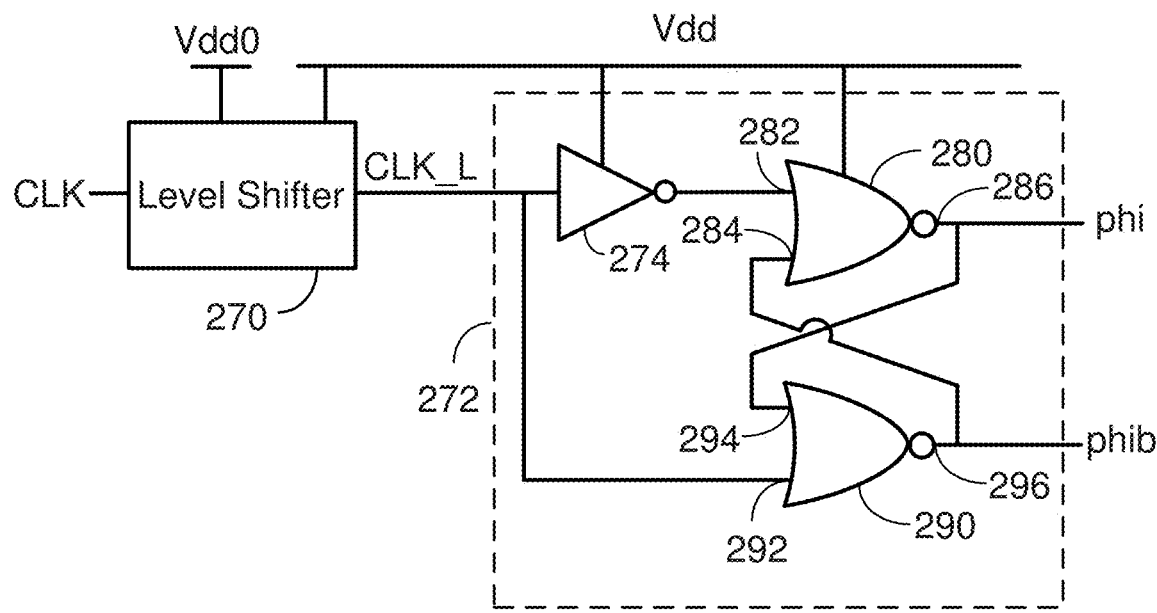
FIG. 2B shows an example of a level shifter and a control signal generator configured to generate control signals for the bootstrap circuit according to certain aspects of the present disclosure.

FIG. 2B shows an example of a level shifter 270 and a control signal generator 272 for generating the control signals phi and phib from the clock signal CLK. The level shifter 270 is configured to shift the voltage of the clock signal CLK from the second voltage domain to the first voltage domain (e.g., by shifting the amplitude of the clock signal CLK from Vdd0 to Vdd). The level shifter 270 outputs the resulting level-shifted clock signal CLK_L to the control signal generator 272.

The control signal generator 272 operates in the first voltage domain and is configured to generate the control signals phi and phib from the level-shifted clock signal CLK_L. The voltage of each of the control signals phi and phib swings between ground and Vdd. In certain aspects, the control signal generator 272 generates the controls signals phi and phib such that the high phases of the control signals phi and phib are non-overlapping. In other words, the control signals phi and phib are not simultaneously high (e.g., Vdd).

In the example shown in FIG. 2B, the control signal generator 272 includes an inverter 274, a first NOR gate 280, and a second NOR gate 290 powered in the first voltage domain. The first NOR gate 280 has a first input 282, a second input 284, and an output 286. The second NOR gate 290 has a first input 292, a second input 294, and an output 296. In this example, the inverter 274 is coupled between the level shifter 270 and the first input 282 of the first NOR gate 280, and the output 286 of the first NOR gate 280 is coupled to the second input 294 of the second NOR gate 290. Also, the first input 292 of the second NOR gate 290 is coupled to the level shifter 270, and the output 296 of the second NOR gate 290 is coupled to the second input 284 of the first NOR gate 280. In this example, the control signal phi is output from the output 286 of the first NOR gate 280, and the control signal phib is output from the output 296 of the second NOR gate 290.

It is to be appreciated that the control signal generator 272 is not limited to the exemplary implementation shown in FIG. 2B. For example, in other implementations, the control signal generator 272 may include NAND gates instead of the NOR gates 280 and 290 shown in FIG. 2B. In general, the control signal generator 272 may include any suitable combination of logic gates.

Figure 2C:
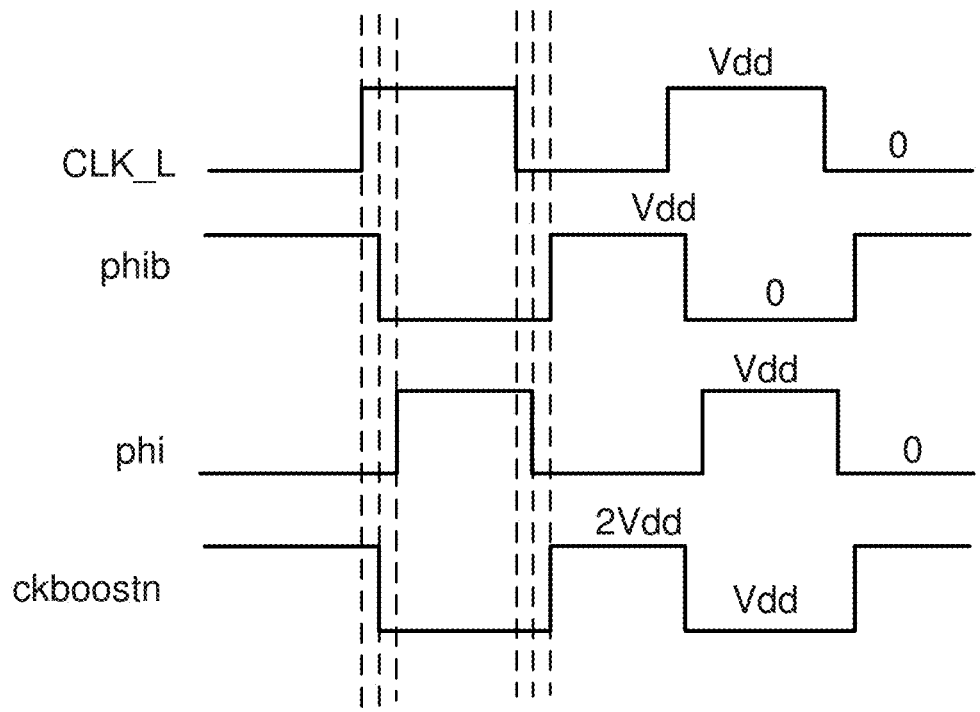
FIG. 2C is a timing diagram showing exemplary waveforms of the control signals according to certain aspects of the present disclosure.

FIG. 2C is a timing diagram showing exemplary waveforms of the control signals phi and phib, the level-shifted clock signal CLK_L, and the boosted control signal ckboostn according to certain aspects. In this example, the voltage of the level-shifted clock signal CLK_L swings between ground and Vdd. The level shifter 270 generates the level-shifted clock signal CLK_L by shifting the voltage of the clock signal CLK (which swings between ground and Vdd0).

The voltage of each of the control signals phi and phib swings between ground and Vdd since the control signal generator 272 is powered in the first voltage domain. In this example, the high phases of the control signals phi and phib are non-overlapping (i.e., the control signals phi and phib are not simultaneously high (e.g., Vdd)).

The voltage of the boosted control signal ckboostn swings between Vdd and 2 Vdd (assuming a boost efficiency of approximately one). The high voltage of 2 Vdd allows the boosted control signal ckboostn to turn on the first switch 220 when the first switch 220 is implemented with an NFET.

Returning in FIG. 2A, exemplary operations of the bootstrap circuit 120 will now be discussed according to certain aspects. During a first phase, the clock signal CLK_L is low, the control signal phi is low (e.g., approximately ground potential), the control signal phib is high (e.g., approximately Vdd), and the boosted control signal ckboostn is high (e.g., approximately 2 Vdd). This causes the boosted control signal ckboostn (which is at 2 Vdd) to turn on the first switch 220, and the control signal phib (which is high) to turn on the second switch 230 and the fourth switch 240. As a result, the first terminal 224 of the boost capacitor 225 is coupled to the supply rail through the first switch 220, and the second terminal 227 of the boost capacitor 225 is coupled to ground through the second switch 230. This causes the first terminal 224 of the boost capacitor 225 to charge to the supply voltage Vdd of the first voltage domain. Also, the gate of the switch transistor 110 is coupled to ground through the fourth switch 240, which turns off the switch transistor 110. The control input 238 of the third switch 235 is also coupled to ground through the fourth switch 240, which turns off the third switch 235.

As discussed above, the control signal phi is low during the first phase. This causes the control signal phi to turn off the transistor 215 and turn on the transistor 218. As a result, the gate of the transistor 210 is coupled to the supply rail through the transistor 218. This turns off the transistor 210, which is implemented with a PFET in this example.

Thus, during the first phase, the boost capacitor 225 is charged to the supply voltage Vdd of the first voltage domain, and the switch transistor 110 is turned off. Also, the output clock signal ckout is approximately equal to zero volts during the first phase since the output 126 of the bootstrap circuit 120 is coupled to ground through the fourth switch 240.

During a second phase of the clock signal CLK_L (which follows the first phase), the control signal phi becomes high (e.g., Vdd), the boosted control signal ckboostn becomes low (e.g., Vdd), and the control signal phib becomes low (e.g., ground potential). This causes the boosted control signal ckboostn to turn off the first switch 220 (which is implemented with an NFET having a source coupled to the first terminal 224 of the boost capacitor 225). This also causes the control signal phib (which is low) to turn off the second switch 230 and the fourth switch 240. As a result, the first terminal 224 of the boost capacitor 225 is decoupled from the supply rail and the second terminal 227 of the boost capacitor 225 is decoupled from ground. In addition, the output 126 of the bootstrap circuit 120 is decoupled from ground.

As discussed above, the control signal phi becomes high during the second phase. This causes the control signal phi to turn on the transistor 215 and turn off the transistor 218. As a result, the gate of the transistor 210 is coupled to the second terminal 227 of the boost capacitor 225 through the transistor 215. The source of the transistor 210 is coupled to the first terminal 224 of the boost capacitor 225. As a result, the source-to-gate voltage of the transistor 210 is approximately equal to the voltage across the boost capacitor 225. Since the boost capacitor 225 is charged to Vdd during the first phase, the source-to-gate voltage of the transistor 210 is approximately equal to Vdd, which turns on the transistor 210 (assuming Vdd is equal to or greater than the threshold voltage of the transistor 210). As a result, the first terminal 224 of the boost capacitor 225 is coupled to the output 126 through the transistor 210.

The first terminal 224 of the boost capacitor 225 is also coupled to the control input 238 of the third switch 235 through the transistor 210, which turns on the third switch 235. As a result, the second terminal 227 of the boost capacitor 225 is coupled to the input 122 of the bootstrap circuit 120 through the third switch 235, and the input voltage Vin at the input 122 is applied to the second terminal 227 of the boost capacitor 225 through the third switch 235. This boosts the voltage at the first terminal 224 of the boost capacitor 225 to approximately Vdd+Vin (assuming a boost efficiency of one). Since the first terminal 224 of the boost capacitor 225 is coupled to the output 126 of the bootstrap circuit 120 through the transistor 210, the voltage of the output clock signal ckout at the output 126 is approximately equal to Vdd+Vin during the second phase, which is input to the gate of the switch transistor 110. The voltage Vdd+Vin at the gate of the switch transistor 110 tracks changes in the input voltage Vin at the source of the switch transistor 110, thereby providing the switch transistor 110 with a gate-to-source voltage that is approximately equal to Vdd. In this example, the boost voltage Vb in FIG. 1 is equal to Vdd.

A challenge with generating the control signals phi and phib is that the level shifter 270 used to shift the voltage of the clock signal CLK consumes additional power and may have a large delay that varies over process corners, which introduces additional latency in the system. In addition, the logic in the control signal generator 272 is powered in the first voltage domain, which has a higher supply voltage Vdd than the second voltage domain, and therefore consumes more power compared with powering the logic in the second voltage domain.

To address the above, aspects of the present disclosure embed control signal boosting in the bootstrap circuit 120. This allows the level shifter 270 shown in FIG. 2A to be omitted and the control signal generator 272 to be powered in the second voltage domain for reduced power consumption and latency, as discussed further below.

Figure 3A:
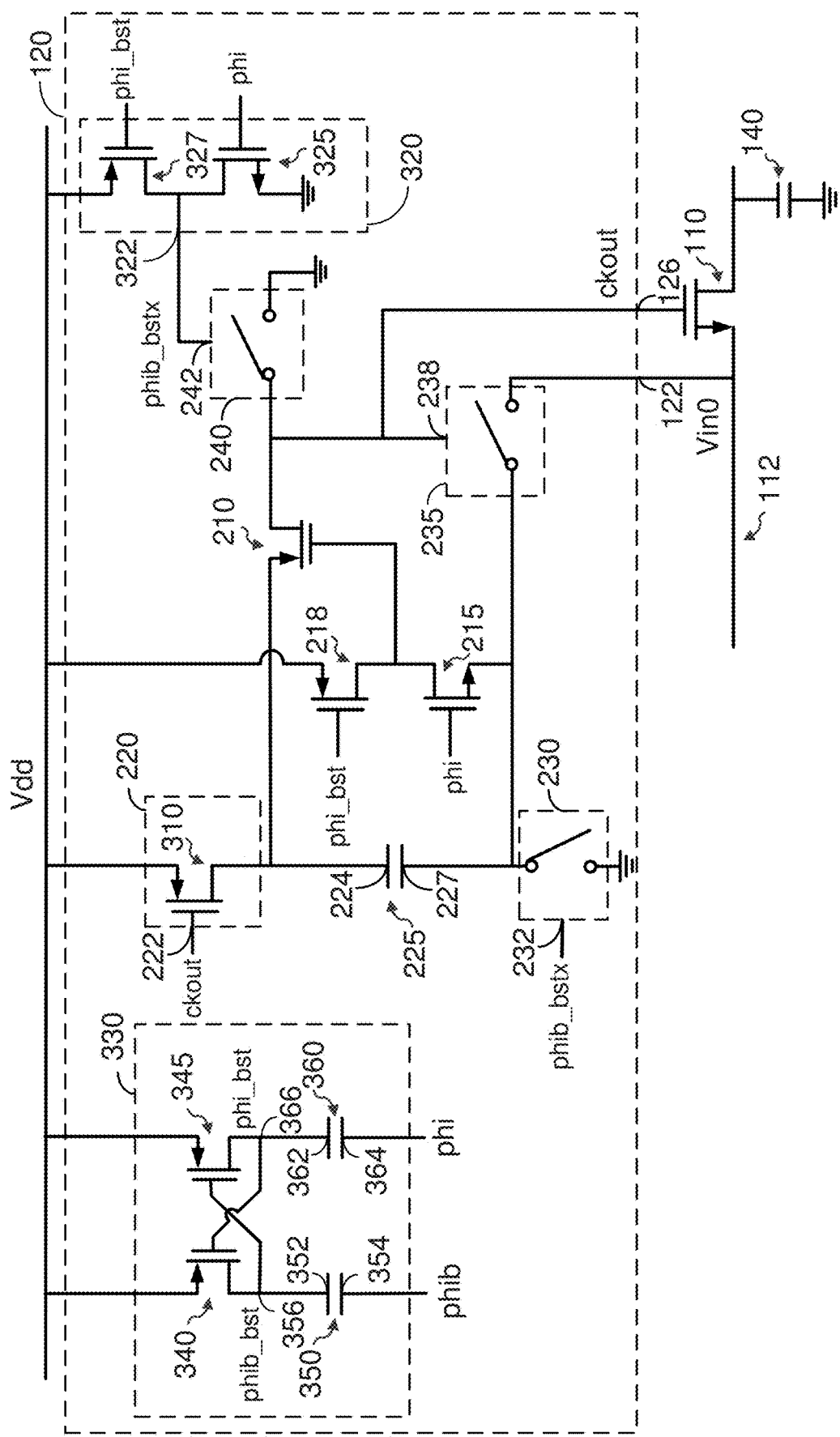
FIG. 3A shows an exemplary implementation of a dual voltage level bootstrap circuit according to certain aspects of the present disclosure.

FIG. 3A shows an exemplary implementation of the bootstrap circuit 120 according to certain aspects. In this example, the bootstrap circuit 120 is a dual voltage level bootstrap circuit in that the bootstrap circuit 120 generates the output clock signal ckout for the switch transistor 110 in the first voltage domain based on control signals phi and phib generated in the second voltage domain where each of the control signals phi and phib has a voltage swing between ground and Vdd0. This allows the level shifter 270 shown in FIG. 2A to be omitted and the control signal generator 272 to be powered in the second voltage domain for reduced power consumption and latency.

In this example, the bootstrap circuit 120 includes the boost capacitor 225, the first switch 220, the second switch 230, the third switch 235, the fourth switch 240, and the transistors 210, 215, and 218 discussed above with reference to FIG. 2A. For brevity, the description of these components given above is not repeated here.

In this example, the first switch 220 is implemented with a PFET 310 and the control input 222 of the first switch 220 is coupled to the output 126 to receive the output clock signal ckout. Thus, in this example, the on/off state of the first switch 220 is controlled by the output clock ckout. Implementing the first switch 220 with the PFET 310 allows the first switch 220 to be turned on without the need for a voltage booster (e.g., voltage doubler) to generate a control signal greater than the supply voltage Vdd. As a result, the boost circuit 245 shown in FIG. 2A may be omitted in this example. In the example in FIG. 3A, the source of the PFET 310 is coupled to the supply rail, the gate of the PFET 310 is coupled to the control input 222, and the drain of the PFET 310 is coupled to the first terminal 224 of the boost capacitor 225. However, it is to be appreciated that the first switch 220 is not limited to this example.

In this example, the bootstrap circuit 120 includes a boost circuit 330. As discussed further below, the boost circuit 330 is configured to generate one or more control signals for driving PFETs in the bootstrap circuit 120 based on the control signals phi and phib from the second voltage domain. The boost circuit 330 includes a first PFET 340, a second PFET 345, a first capacitor 350, and a second capacitor 360. The sources of the first PFET 340 and the second PFET 345 are coupled to the supply rail of the first voltage domain. The first PFET 340 and the second PFET 345 are cross-coupled in which the gate of the first PFET 340 is coupled to the drain of the second PFET 345 and the gate of the second PFET 345 is coupled to the drain of the first PFET 340. The first capacitor 350 has a first terminal 352 coupled to the drain of the first PFET 340 and a second terminal 354 driven by the control signal phib. The second capacitor 360 has a first terminal 362 coupled to the drain of the second PFET 345 and a second terminal 364 driven by the control signal phi.

In this example, the boost circuit 330 generates a first boosted control signal phi_bst at the first terminal 362 of the second capacitor 360. The first boosted control signal phi_bst has a voltage swing between Vdd and Vdd−Vdd0*k1 where k1 is a boost efficiency of the boost circuit 330. The boost efficiency k1 may be approximately equal to:

$$k1 = \frac{Cb}{Cb + Cn} \quad (1)$$

where Cb is the capacitance of the second capacitor 360 and Cn is the total parasitic capacitance at the node 366. The parasitic capacitance Cn may include a drain capacitance of the second PFET 345. In this example, the boost efficiency k1 may be set to a certain value by choosing the capacitance Cb of the second capacitor 360 accordingly. The boost efficiency k1 is approximately one when the capacitance Cb of the second capacitor 360 is much larger than the parasitic capacitance Cn. In this example, the first boost control signal phi_bst is input to the gate of the transistor 218, which is implemented with a PFET in this example.

The boost circuit 330 may also generate a second boosted control signal phib_bst at the first terminal 352 of the first capacitor 350. The second boosted control signal phib_bst may also have a voltage swing between Vdd and Vdd−Vdd0*k1 assuming the capacitance of the first capacitor 350 is approximately equal to the capacitance of the second capacitor 360 and the parasitic capacitance at node 356 is approximately equal to the parasitic capacitance at node 366.

Thus, in this example, the boost circuit 330 generates control signals phi_bst and phib_bst based on the control signals phi and phib from the second voltage domain (i.e., lower voltage domain in this example), where each of the control signals phi_bst and phib_bst has a voltage swing between Vdd and Vdd−Vdd0*k1. This voltage swing allows the control signal phi_bst to drive a PFET in the bootstrap circuit 120 powered in the first voltage domain. In this case, the control signal phi_bst turn off the PFET when the voltage of the control signal phi_bst is at Vdd (assuming the source of the PFET is coupled to Vdd), and the control signal phi_bst turns on the PFET when the voltage of the control signal phi_bst is at Vdd−Vdd0*k1 (assuming Vdd0*k1 is equal to or greater than the threshold voltage of the PFET). The above voltage swing also allows the control signal phib_bst to drive a PFET for similar reasons.

It is to be appreciated that the boost circuit 330 is not limited to the bootstrap circuit 120 and that the control signals phi_bst and phib_bst may be used to drive PFETs in other circuits powered in the first voltage domain. It is also to be appreciated that the bootstrap circuit 120 is not limited to the exemplary arrangement of PFETs shown in the example in FIG. 3A, and that the bootstrap circuit 120 may include other arrangements of PFETs driven by the boost circuit 330 in other implementations. It is also to be appreciated that, in some implementations, the control signal phi may drive the second terminal 354 of the first capacitor 350 with the control signal phi_bst generated at the first terminal 352 of the first capacitor 350, and the control signal phib may drive the second terminal 364 of the second capacitor 360 with the control signal phib_bst generated at the first terminal 362 of the second capacitor 360.

In this example, the bootstrap circuit 120 also includes a swing circuit 320 having an output 322 coupled to the control input 242 of the fourth switch 240. The swing circuit 320 is configured to receive the control signals phi and phi_bst and generate a control signal phib_bstx having a full voltage swing in the first voltage domain between ground and Vdd. In this example, the voltage swing between ground and Vdd allows the control signal phib_bstx to turn on the fourth switch 240 faster for lower latency compared with a lower voltage swing. In the example shown in FIG. 3A, the control signal phi_bstx is also input to the control input 232 of the second switch 230 (e.g., NFET) to control switching of the second switch 230.

In the example in FIG. 3A, the swing circuit 320 includes a first transistor 325 (e.g., an NFET) and a second transistor 327 (e.g., a PFET). The drain of the first transistor 325 is coupled to the output 322 of the swing circuit 320, the gate of the first transistor 325 is driven by the control signal phi, and the source of the first transistor 325 is coupled to ground. The source of the second transistor 327 is coupled to the supply rail, the gate of the second transistor 327 is driven by the control signal phi_bst from the boost circuit 330, and the drain of the second transistor 327 is coupled to the output 322 of the swing circuit 320.

In this example, the control signal phi turns on the first transistor 325 (e.g., NFET) when the control signal phi is at Vdd0 (assuming Vdd0 is equal to or greater than the threshold voltage of the first transistor 325) and turns off the first transistor 325 when the control signal phi is at ground potential. Also, in this example, the control signal phi_bst turns off the second transistor 327 when the control signal phi_bst is at Vdd and turns on the second transistor 327 when the control signal phi_bst is at Vdd−Vdd0*k1 (assuming Vdd0*k1 is equal to or greater than the threshold voltage of the second transistor 327). In this example, the full-swing control signal phib_bstx is at approximately Vdd when the second transistor 327 is turned on by the control signal phi_bst and the first transistor 325 is turned off by the control signal phi. The full-swing control signal phib_bstx is at approximately ground potential when the second transistor 327 is turned off by the control signal phi_bst and the first transistor 325 is turned on by the control signal phi. In this example, the first transistor 325 may also be referred to as a pull-down transistor since the first transistor 325 pulls the output 322 to ground when the first transistor 325 is turned on, and the second transistor 327 may also be referred to as a pull-up transistor since the second transistor 327 pulls the output 322 to Vdd on the supply rail when the second transistor 327 is turned on.

Figure 3B:
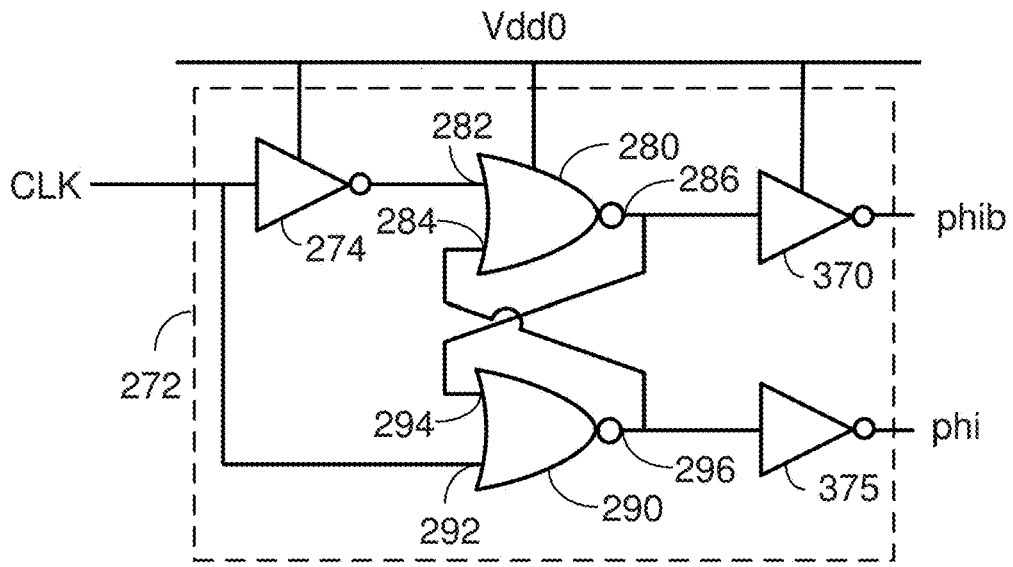
FIG. 3B shows an example of a control signal generator for the bootstrap circuit of FIG. 3A according to certain aspects of the present disclosure.

FIG. 3B shows an example of the control signal generator 272 for generating the control signals phi and phib from the clock signal CLK. In this example, the control signal generator 272 is powered in the second voltage domain instead of the first voltage domain, which reduces power consumption since the second voltage domain has a lower supply voltage Vdd0.

In the example in FIG. 3B, the control signal generator 272 includes the inverter 274 and the NOR gates 280 and 290 discussed above with reference to FIG. 2B. However, in this example, the inverter 274 and the NOR gates 280 and 290 are powered in the second voltage domain and receive the clock signal CLK without level shifting by the level shifter 270, which is omitted in this example. In this example, the control signal generator 272 also includes inverters 370 and 375 in which the input of the inverter 370 is coupled to the output 286 of the first NOR gate 280 and the input of the inverter 375 is coupled to the output 296 of the second NOR gate 290.

In this example, the control signal phi is output from the output of the inverter 375 and the control signal phib is output from the inverter 370. Each of the control signals phi and phib has a voltage swing between ground and Vdd0, which is less than Vdd. This is because the control signal generator 272 is powered in the second voltage domain in this example.

Figure 3C:
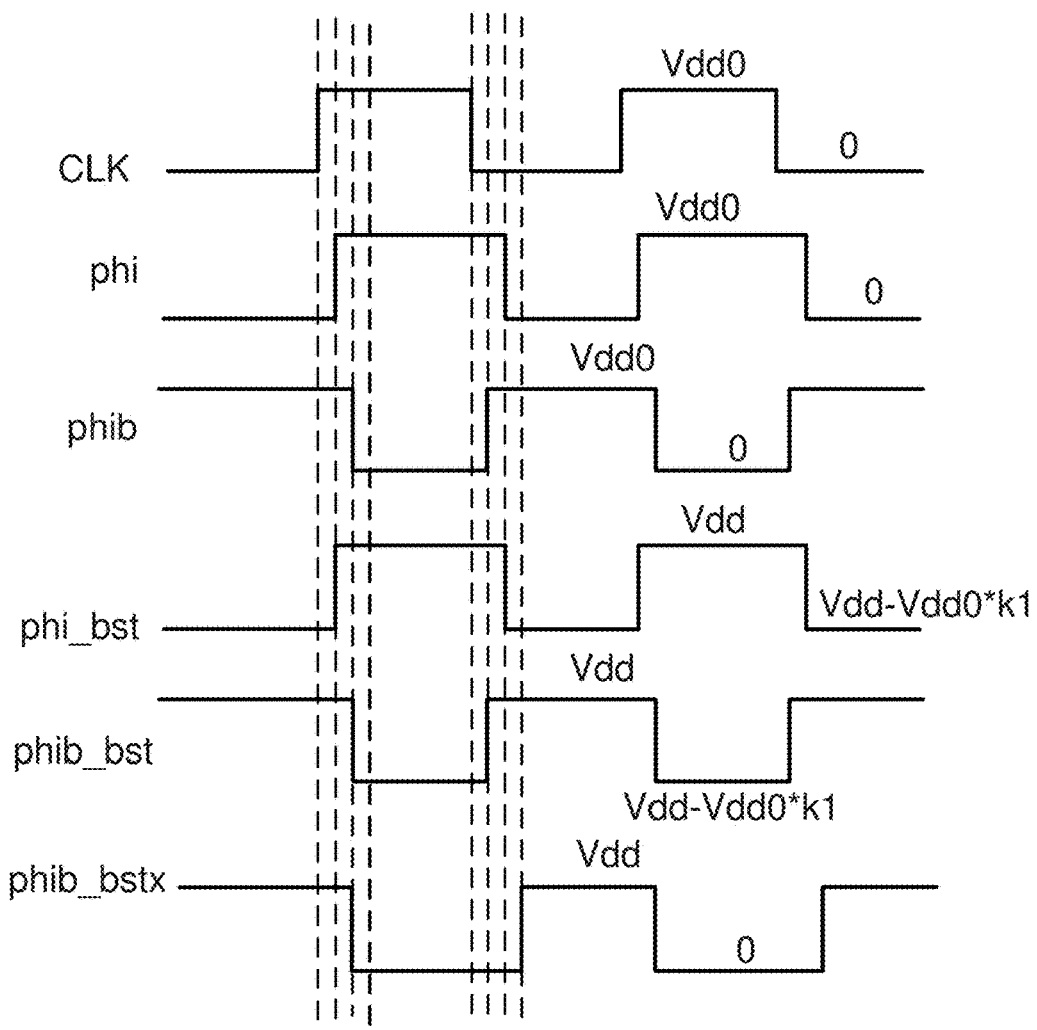
FIG. 3C is a timing diagram showing exemplary waveforms of control signals according to certain aspects of the present disclosure.

FIG. 3C is a timing diagram showing exemplary waveforms of the control signals phi and phib, the clock signal CLK, and the boosted control signals phi_bst and phib_bst from the boost circuit 330 and the full-swing control signal phib_bstx from the swing circuit 320.

In this example, the voltage of the clock signal CLK swings between ground and Vdd0. The voltage of each of the control signals phi and phib also swings between ground and Vdd0 since the control signal generator 272 is powered in the second voltage domain in this example. In this example, the low phases of the control signals phi and phib are non-overlapping (i.e., the control signals phi and phib are not simultaneously low (e.g., ground potential)). The non-overlapping low phases help prevent the first PFET 340 and the second PFET 345 from being turned on simultaneously. In this example, each of the control signals phi and phib has approximately the same frequency as the clock signal CLK. In other words, each of the control signals phi and phib oscillates between ground potential and Vdd0 at a frequency approximately equal to the frequency of the clock signal.

The voltage of each of the boosted control signals phi_bst and phib_bst swings between Vdd and Vdd−Vdd0*k1 (assuming a boost efficiency of k1). The voltage of the full-swing control signal phib_bstx swings between ground and Vdd.

Returning to FIG. 3A, exemplary operations of the bootstrap circuit 120 will now be discussed according to certain aspects. In this example, each of the transistors 218 and 327 driven by the control signal phi_bst is implemented with a respective PFET.

During a first phase, the clock signal CLK is low, the control signal phi is low (e.g., approximately ground potential), the boosted control signal phi_bst is low (e.g., approximately Vdd−Vdd0*k1), and the control signal phib_bstx is high (e.g., approximately Vdd). This causes the control signal phib_bstx (which is high) to turn on the second switch 230 and the fourth switch 240. The gate of the switch transistor 110 is coupled to ground through the fourth switch 240, which turns off the switch transistor 110 and causes the output clock signal ckout to go low (e.g., ground potential). Also, the control input 238 of the third switch 235 is coupled to ground through the fourth switch 240, which turns off the third switch 235.

The low output clock signal ckout turns on the first switch 220 (which is implemented with the PFET 310 in this example). As a result, the first terminal 224 of the boost capacitor 225 is coupled to the supply rail through the first switch 220. The second terminal 227 of the boost capacitor 225 is coupled to ground through the second switch 230 (which is turned on by the control signal phib_bstx). This causes the first terminal 224 of the boost capacitor 225 to charge to the supply voltage Vdd of the first voltage domain.

As discussed above, the control signal phi is low (e.g., ground) and the boosted control signal phi_bst is low (e.g., approximately Vdd−Vdd0*k1) during the first phase. This causes the control signal phi to turn off the transistor 215 and the boosted control signal phi_bst to turn on the transistor 218 (assuming the transistor 218 has a threshold voltage equal to or less than Vdd0*k1). As a result, the gate of the transistor 210 is coupled to the supply rail through the transistor 218. This turns off the transistor 210, which is implemented with a PFET in this example.

Thus, during the first phase, the boost capacitor 225 is charged to the supply voltage Vdd of the first voltage domain, and the switch transistor 110 is turned off. Also, the output clock signal ckout is approximately equal to zero volts (i.e., ground potential) during the first phase since the output 126 of the bootstrap circuit 120 is coupled to ground through the fourth switch 240.

During a second phase of the clock signal CLK (which follows the first phase), the clock signal CLK is high (e.g., Vdd0), the control signal phi is high (e.g. Vdd0), the boosted control signal phi_bst is high (e.g., approximately Vdd), and the control signal phib_bstx is low (e.g., approximately ground). This causes the control signal phib_bstx (which is low) to turn off the second switch 230 and the fourth switch 240. As a result, the second terminal 227 of the boost capacitor 225 is decoupled from ground and the output 126 of the bootstrap circuit 120 is decoupled from ground.

As discussed above, the control signal phi becomes high (e.g., Vdd0) and the control signal phi_bst becomes high (e.g., Vdd) during the second phase. This causes the control signal phi_bst to turn off the transistor 218 and the control signal phi to turn on the transistor 215 (assuming Vddo is equal to or greater than the threshold voltage of the transistor 215). As a result, the gate of the transistor 210 is coupled to the second terminal 227 of the boost capacitor 225 through the transistor 215. The source of the transistor 210 is coupled to the first terminal 224 of the boost capacitor 225. As a result, the source-to-gate voltage of the transistor 210 is approximately equal to the voltage across the boost capacitor 225. Since the boost capacitor 225 is charged to Vdd during the first phase, the source-to-gate voltage of the transistor 210 is approximately equal to Vdd, which turns on the transistor 210 (assuming Vdd is equal to or greater than the threshold voltage of the transistor 210). As a result, the first terminal 224 of the boost capacitor 225 is coupled to the output 126 of the bootstrap circuit 120 through the transistor 210. This causes the output clock signal ckout to go to Vdd, which turns on the third switch 235 and turns off the first switch 220.

The turning on of the third switch 235 couples the second terminal 227 of the boost capacitor 225 to the input 122 of the bootstrap circuit 120 through the third switch 235. As a result, the input voltage Vin at the input 122 is applied to the second terminal 227 of the boost capacitor 225 through the third switch 235. This boosts the voltage at the first terminal 224 of the boost capacitor 225 to approximately Vdd+Vin (assuming a boost efficiency of one). Since the first terminal 224 of the boost capacitor 225 is coupled to the output 126 of the bootstrap circuit 120, the voltage of the output clock signal ckout at the output 126 is boosted to approximately Vdd+Vin during the second phase, which is input to the gate of the switch transistor 110. The voltage Vdd+Vin at the gate of the switch transistor 110 tracks changes in the input voltage Vin at the source of the switch transistor 110, thereby providing the switch transistor 110 with a gate-to-source voltage that is approximately equal to Vdd.

Figure 4:
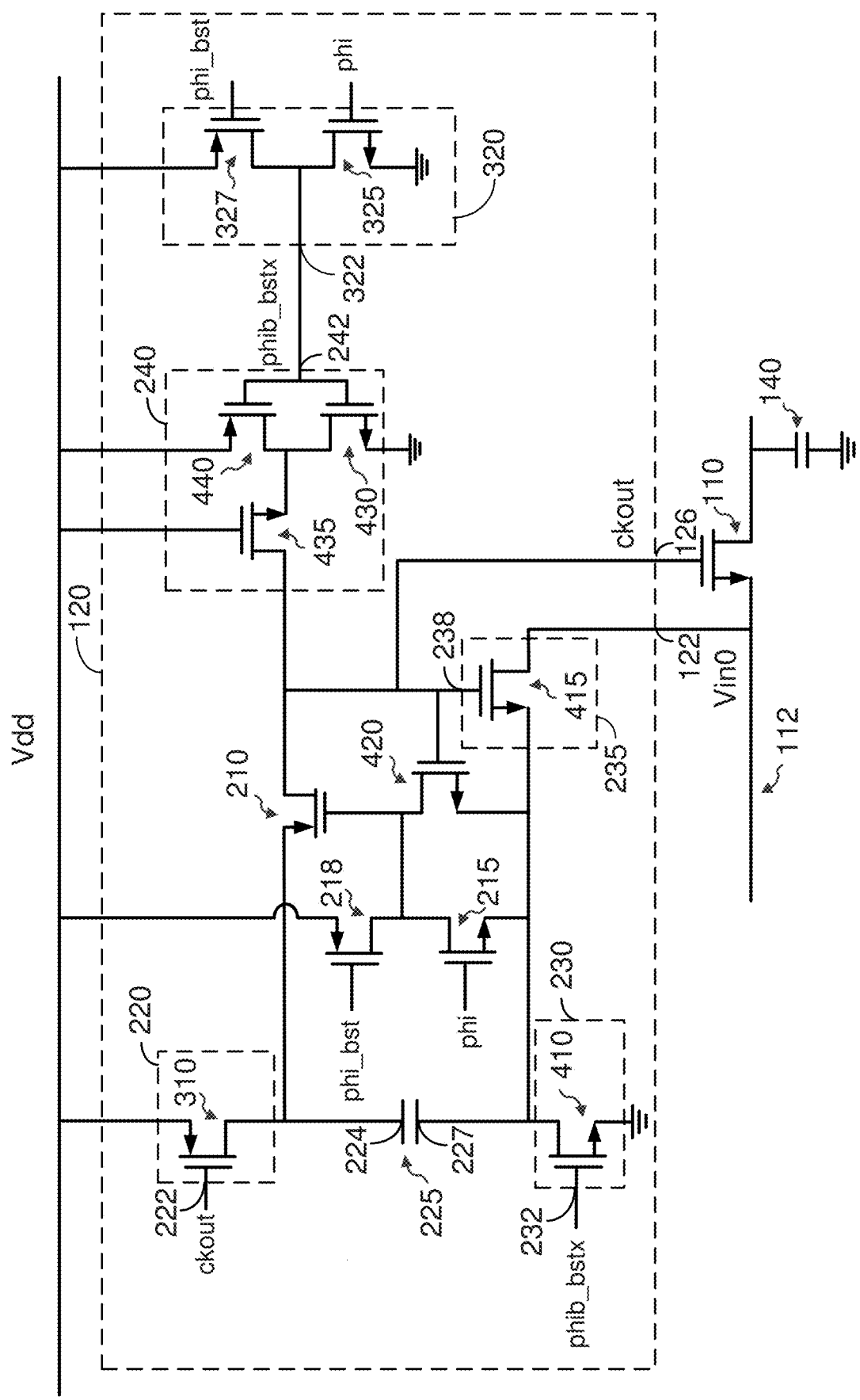
FIG. 4 shows exemplary implementations of switches in the bootstrap circuit according to certain aspects of the present disclosure.

FIG. 4 shows an exemplary implementation of the switches 230, 235, and 240 according to certain aspects. In this example, the second switch 230 includes a transistor 410 (e.g., NFET) where the drain of the transistor 410 is coupled to the second terminal 227 of the boost capacitor 225, the gate of the transistor 410 is coupled to the control input 232 of the second switch 230 (and hence receives the full-swing control signal phib_bstx), and the source of the transistor 410 is coupled to ground. The third switch 235 includes a transistor 415 (e.g., NFET) where the source of the transistor 415 is coupled to the second terminal 227 of the boost capacitor 225, the gate of the transistor 415 is coupled to the output 126 of the bootstrap circuit 120, and the drain of the transistor 415 is coupled to the input 122 of the bootstrap circuit 120.

In this example, the fourth switch 240 includes a first transistor 430 (e.g., first NFET), a second transistor 435 (e.g., second NFET), and a third transistor 440 (e.g., PFET). The gate of the first transistor 430 is coupled to the control input 242 of the fourth switch 240 (and hence receives the control signal phib_bstx), and the source of the first transistor 530 is coupled to ground. The drain of the second transistor 435 is coupled to the output 126 of the bootstrap circuit 120, the gate of the second transistor 435 is coupled to the supply rail, and the source of the second transistor 435 is coupled to the drain of the first transistor 430. The source of the third transistor 440 is coupled to the supply rail, the gate of the third transistor 440 is coupled to the control input 242 of the fourth switch 240 (and hence receives the control signal phib_bstx), and the drain of the third transistor 440 is coupled to the source of the second transistor 435.

In operation, when the control signal phib_bstx is high (e.g., Vdd), the first transistor 430 is turned on and the third transistor 440 is turned off. As a result, the first transistor 430 couples the source of the second transistor 435 to ground. Because the gate of the second transistor 435 is coupled to the supply rail, the gate-to-source voltage of the second transistor 435 is approximately equal to Vdd, which turns on the second transistor 435. Thus, the first transistor 430 and the second transistor 435 are both turned on, and the output 126 of the bootstrap circuit 120 is coupled to ground through the first transistor 430 and the second transistor 435. Therefore, the fourth switch 240 couples the output 126 of the bootstrap circuit 120 to ground when the control signal phib_bstx is high (e.g., Vdd).

When the control signal phib_bstx is low (e.g., ground), the first transistor 430 is turned off and the third transistor 440 is turned on. As a result, the third transistor 440 couples the source of the second transistor 435 to the supply rail. Because the gate of the second transistor 435 is coupled to the supply rail, the gate-to-source voltage of the second transistor 435 is approximately zero volts, which turns off the second transistor 435. As a result, the first transistor 430 and the second transistor 435 are both turned off, and the output 126 of the bootstrap circuit 120 is decoupled from ground. Therefore, the fourth switch 240 decouples the output 126 of the bootstrap circuit 120 from ground when the control signal phib_bstx is low.

It is to be appreciated that the fourth switch 240 is not limited to the exemplary implementation shown in FIG. 4. For example, the fourth switch 240 may be implemented with other arrangements of transistors, or may be implemented with a single transistor in other implementations.

In the example shown in FIG. 4, the bootstrap circuit 120 also includes a transistor 420 where the drain of the transistor 420 is coupled to the gate of the transistor 210, the source of the transistor 420 is coupled to the second terminal 227 of the boost capacitor 225, and the gate of the transistor 420 is coupled to the output 126 of the bootstrap circuit 120. The transistor 420 may be implemented with an NFET (as shown in the example in FIG. 4) or another type of transistor.

When the voltage at the output 126 is approximately equal to Vdd+Vin during the second phase, the transistor 420 is turned on and couples the gate of the transistor 210 to the second terminal 227 of the boost capacitor 225 through the transistor 420. When the voltage at the output 126 is approximately equal to zero volts during the first phase, the transistor 420 is turned off.

In this example, the transistor 420 helps the transistor 215 couple the gate of the transistor 210 to the second terminal 227 of the boost capacitor 225 during the second phase. The transistor 420 is able to keep the gate of the transistor 210 coupled to the second terminal 227 of the boost capacitor 225 for cases where the input voltage Vin swings high since the transistor 420 is turned by the boosted voltage Vdd+Vin. It is to be appreciated that the transistor 420 may be omitted in some implementations.

Figure 5A:
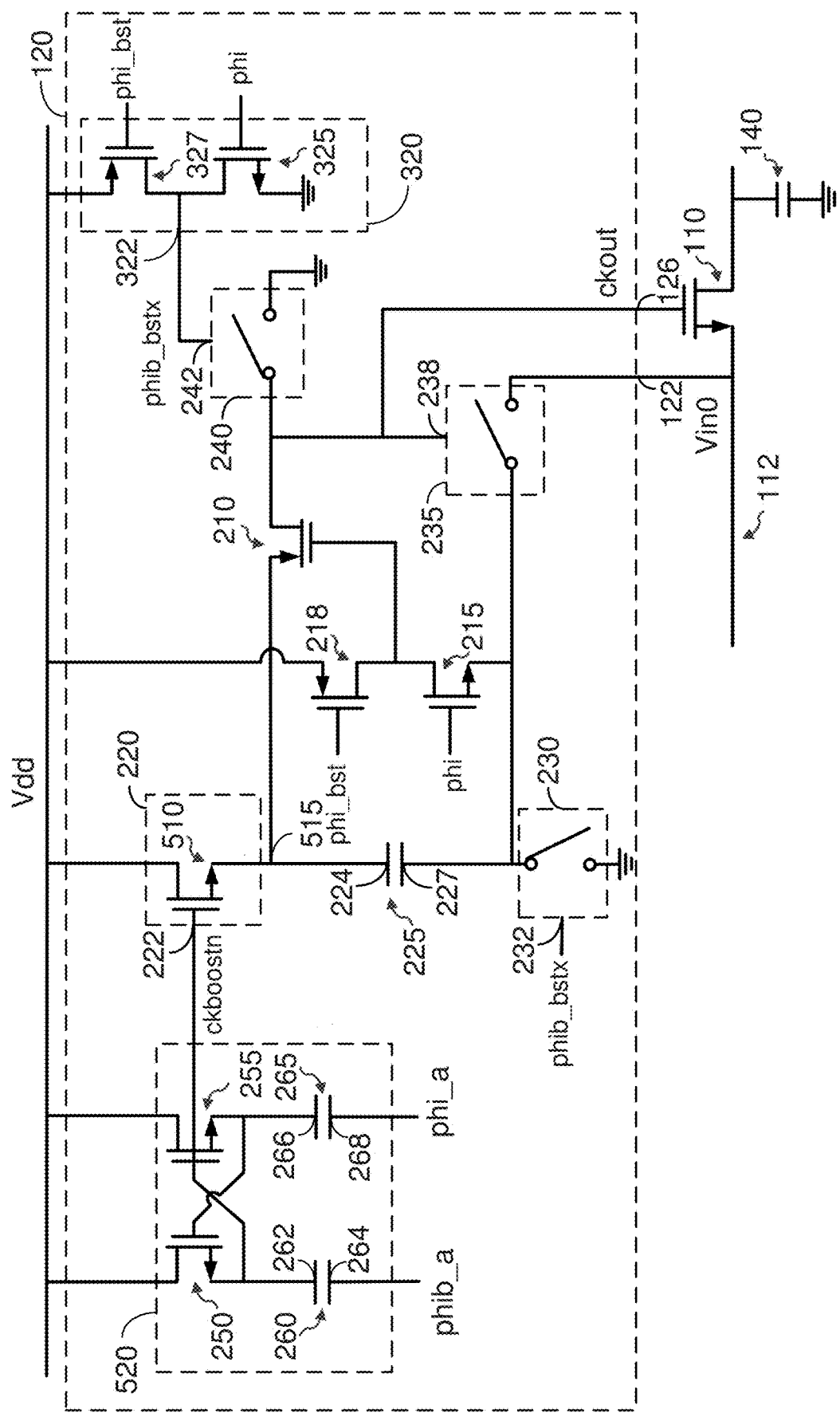
FIG. 5A shows another exemplary implementation of a dual voltage level bootstrap circuit according to certain aspects of the present disclosure.
Figure 5B:
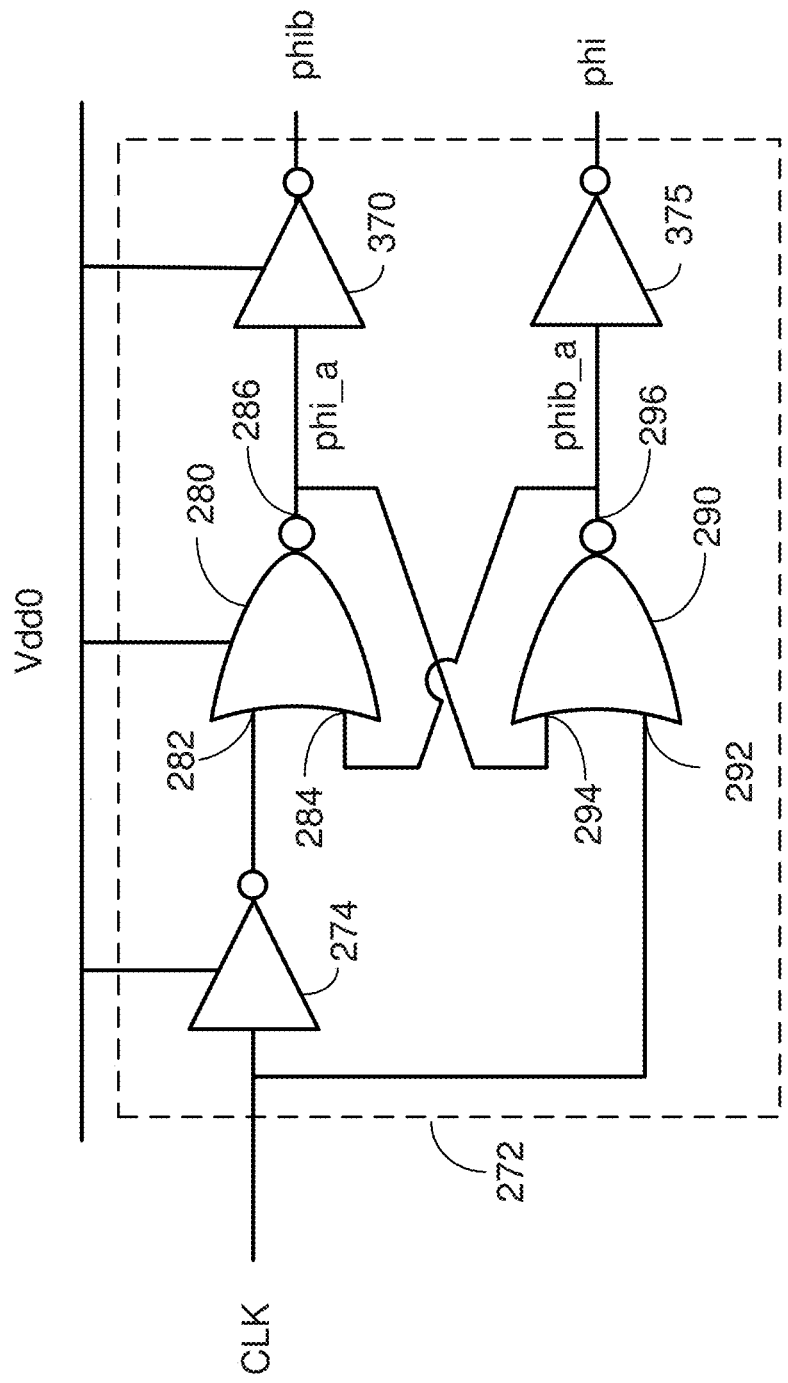
FIG. 5B shows an example of a control signal generator for the bootstrap circuit of FIG. 5A according to certain aspects of the present disclosure.

FIG. 5A shows another exemplary implementation of the bootstrap circuit 120 according to certain aspects. In this example, the first switch 220 is implemented with an NFET 510 instead of the PFET 310 in the example shown in FIG. 3A. An advantage of using the NFET 510 is that the NFET 510 may have less parasitic capacitance at the node 515 compared with the PFET 310. This is because the bulk of the PFET 310 may be coupled to node 515, which adds parasitic capacitance. However, for the NFET 510, the bulk of the NFET may be coupled to ground (i.e., Vss) instead of node 515, and therefore does not have the extra bulk parasitic capacitance.

In this example, the bootstrap circuit 120 also includes a second boost circuit 520 to generate the boosted control signal ckboostn for the NFET 510. As discussed further below, the boosted control signal ckboostn has a high voltage greater than Vdd in order to turn on the NFET 510 to charge the boost capacitor 225. Note that the boost circuit 330 is not shown in FIG. 5A in order to provide space in FIG. 5A to show the second boost circuit 520. In this example, the second boost circuit 520 is implemented with the exemplary boost circuit 245 shown in FIG. 2A. Therefore, the second boost circuit 520 includes the first transistor 250 (e.g., first NFET), the second transistor 255 (e.g., second NFET), the first capacitor 260, and the second capacitor 265 discussed above. In the discussion below, the boost circuit 330 is referred to as the first boost circuit 330.

In this example, the second terminal 264 of the first capacitor 260 is driven by the control signal phib_a and the second terminal 268 of the second capacitor 265 is driven by the control signal phi_a. Each of the control signals phib_a and phi_a has a voltage swing between ground and Vdd0 since the control signal generator 272 is powered in the second voltage domain in this example. Referring to FIG.

5B, the control signal phi_a may be taken from the output 286 of the first NOR gate 280 and the control signal phib_a may be taken from the output 296 of the second NOR gate 290. However, it is to be appreciated that the present disclosure is not limited to this example.

Figure 5C:
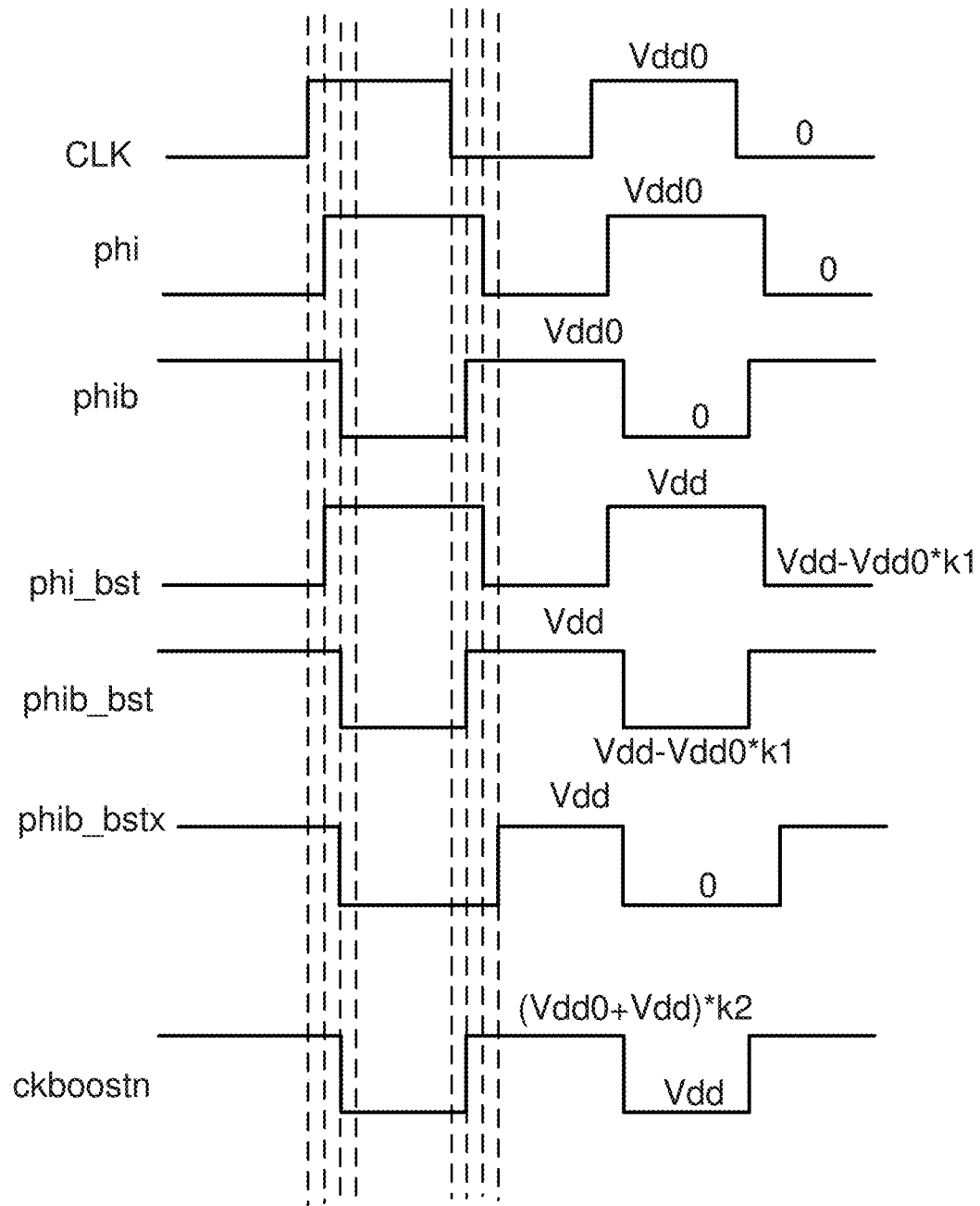
FIG. 5C is a timing diagram showing exemplary waveforms of the control signals for the bootstrap circuit of FIG. 5A according to certain aspects of the present disclosure.

FIG. 5C shows an exemplary waveform of the boosted control signal ckboostn generated by the second boost circuit 520. As shown in FIG. 5C, the boosted control signal ckboostn has a voltage swing of between Vdd and (Vdd0+Vdd)*k2 where k2 is the boost efficiency of the second boost circuit 520. When the boost efficiency is close to one, the high voltage of the boosted control signal ckboostn is approximately equal to Vdd0+Vdd. This is because the controls signal phib_a driving the second terminal 264 of the first capacitor 260 has a high voltage of Vdd0 in this example.

During the first phase discussed above, the voltage of the boosted control signal ckboostn is approximately equal to (Vdd0+Vdd)*k2. This causes the boosted control signal ckboostn to turn on the NFET 510 and the boost capacitor 225 to charge to Vdd (assuming (Vdd0+Vdd)*k2 minus Vdd is equal to or greater than the threshold voltage of the NFET 510). The operations of the switches 230, 235, and 240 and the transistors 210, 215, and 218 during the first phase are discussed above with reference to FIG. 3A.

During the second phase discussed above, the voltage of the boosted control signal ckboostn is approximately equal to Vdd. This causes the boosted control signal ckboostn to turn off the NFET 510 since the voltage at the source of the NFET 510 is at least Vdd during the second phase. The operations of the switches 230, 235, and 240 and the transistors 210, 215, and 218 during the second phase are discussed above with reference to FIG. 3A.

Figure 6A:
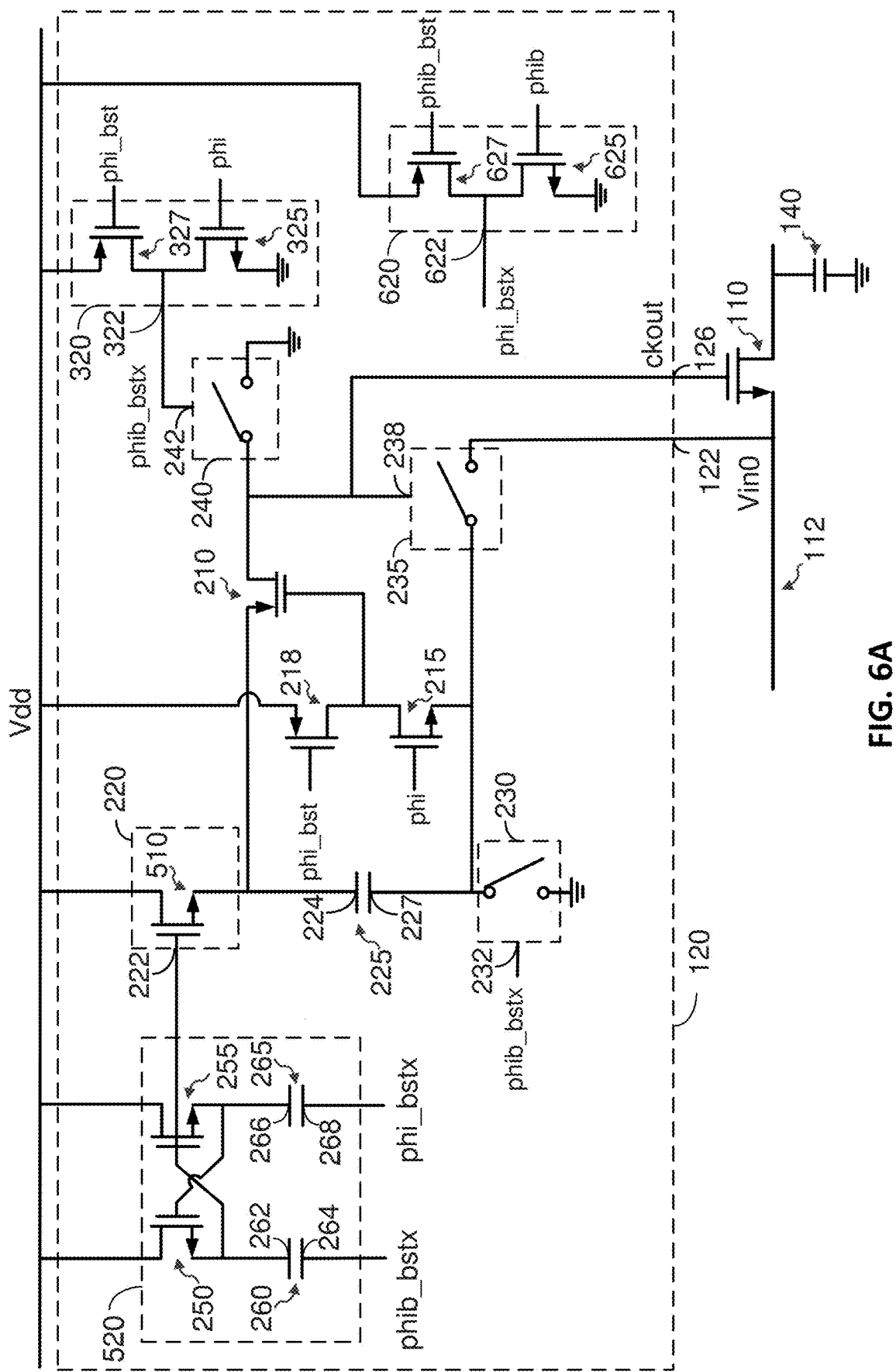
FIG. 6A shows yet another exemplary implementation of a dual voltage level bootstrap circuit according to certain aspects of the present disclosure.

FIG. 6A shows another exemplary implementation of the bootstrap circuit 120 in which the first switch 220 is implemented with the NFET 510 and the bootstrap circuit 120 includes the second boost circuit 520 discussed above with reference to FIG. 5A. In this example, the bootstrap circuit 120 further includes a second swing circuit 620. In the discussion below, the swing circuit 320 is referred to as the first swing circuit 320.

Figure 6B:
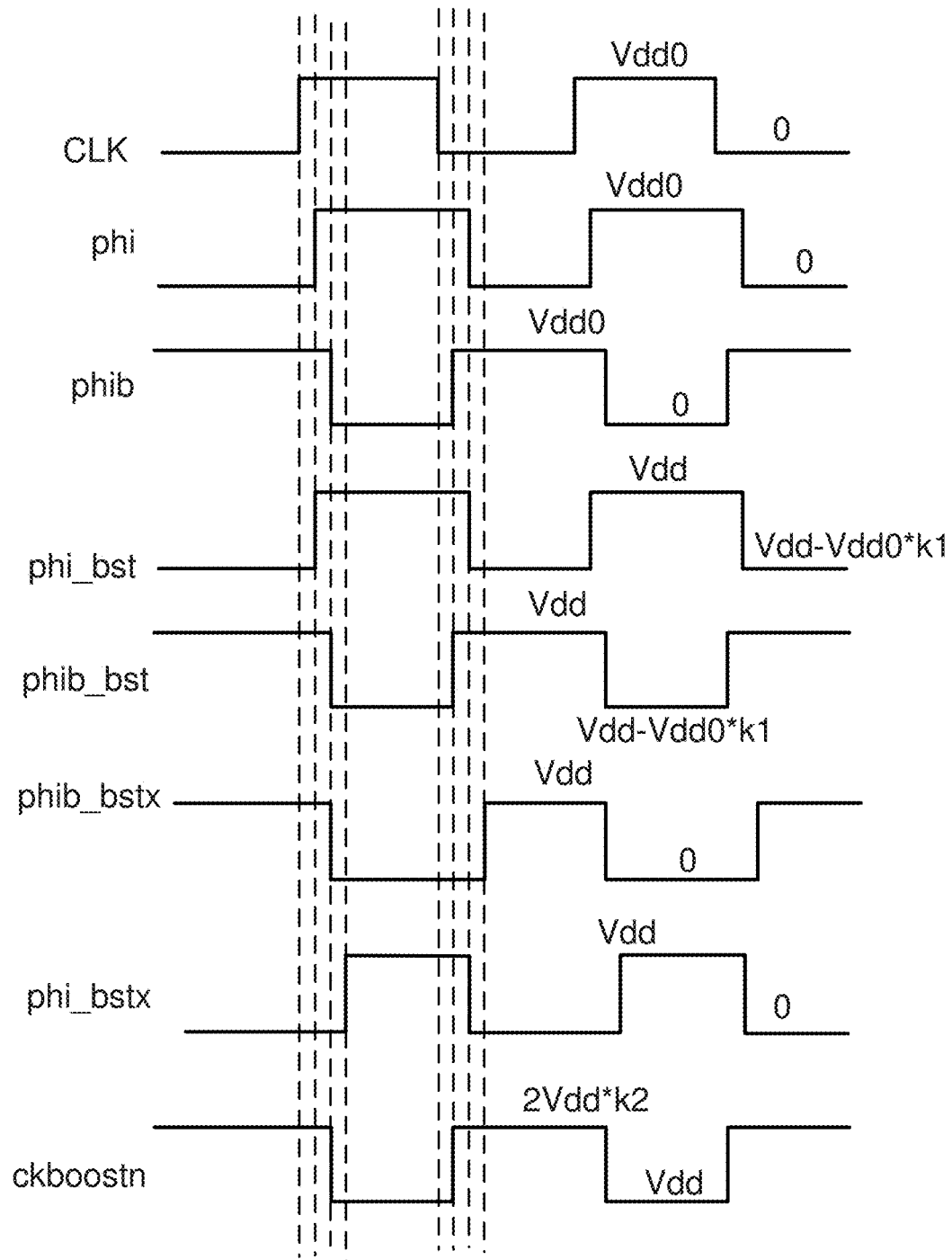
FIG. 6B is a timing diagram showing exemplary waveforms of control signals for the bootstrap circuit of FIG. 6A according to certain aspects of the present disclosure.

In this example, the second swing circuit 620 has an output 622. The second swing circuit 620 is configured to receive the control signal phib from the control signal generator 272 and the control signal phi_bst from the first boost circuit 330 (shown in FIG. 3A), generate a control signal phi_bstx having a full voltage swing between ground and Vdd, and output the control signal phi_bstx at the output 622. FIG. 6B shows an exemplary waveform of the control signal phi_bstx according to certain aspects.

In the example in FIG. 6A, the second swing circuit 620 includes a first transistor 625 (e.g., an NFET) and a second transistor 627 (a PFET). The drain of the first transistor 625 is coupled to the output 622 of the second swing circuit 620, the gate of the first transistor 625 is driven by the control signal phib, and the source of the first transistor 625 is coupled to ground. The source of the second transistor 627 is coupled to the supply rail, the gate of the second transistor 627 is driven by the control signal phib_bst from the first boost circuit 330, and the drain of the second transistor 727 is coupled to the output 622 of the second swing circuit 620. The control signal phib_bst may be taken from node 356 of the first boost circuit 330 shown in FIG. 3A.

In the example in FIG. 6A, the full-swing control signals phib_bstx and phi_bstx from the first swing circuit 320 and the second swing circuit 620, respectively, are input to the second boost circuit 520. In this example, the control signal phib_bstx from the first swing circuit 320 drives the second terminal 264 of the first capacitor 260 and the control signal phi_bstx from the second swing circuit 620 drives the second terminal 268 of the second capacitor 265. Each of the control signals phib_bstx and phi_bstx has a full voltage swing between ground and Vdd in this example.

FIG. 6B shows an exemplary waveform of the boosted control signal ckboostn generated by the second boost circuit 520 in this example. As shown in FIG. 6B, the boosted control signal ckboostn has a voltage swing of between Vdd and 2 Vdd*k2 where k2 is the boost efficiency of the second boost circuit 520. When the boost efficiency is close to one, the high voltage of the boosted control signal ckboostn is approximately equal to 2 Vdd. In this example, the second boost circuit 520 may also be referred to as a voltage doubler.

During the first phase discussed above, the voltage of the boosted control signal ckboostn is approximately equal to 2 Vdd*k2. This causes the boosted control signal ckboostn to turn on the NFET 510 and the boost capacitor 225 to charge to Vdd (assuming 2 Vdd*k2 minus Vdd is equal to or greater than the threshold voltage of the NFET 510). The operations of the switches 230, 235, and 240 and the transistors 210, 215, and 218 during the first phase are discussed above with reference to FIG. 3A.

During the second phase discussed above, the voltage of the boosted control signal ckboostn is approximately equal to Vdd. This causes the boosted control signal ckboostn to turn off the NFET 510 since the voltage at the source of the NFET 510 is at least Vdd during the second phase. The operations of the switches 230, 235, and 240 and the transistors 210, 215, and 218 during the second phase are discussed above with reference to FIG. 3A.

It is to be appreciated that the present disclosure is not limited to the terminology used above to describe aspects of the present disclosure. For example, a buffer may also be referred to as a driver, an amplifier, or another term. A switch transistor may also be referred to as a switch, a transistor, a bootstrap switch, a bootstrapped switch, a sampling switch (e.g., in the context of analog-to-digital conversion), or another term. A bootstrap circuit may also be referred to as a bootstrap switch, a boost circuit, or another term. In general, a bootstrap circuit covers any circuit configured to drive the gate of a switch transistor with a boosted voltage that tracks the voltage of a signal in a signal path (e.g., voltage at a terminal (e.g., source) of the switch transistor). It is also to be appreciated that a bootstrap circuit and a switch transistor may also collectively be referred to as a bootstrap switch.

Figure 7:
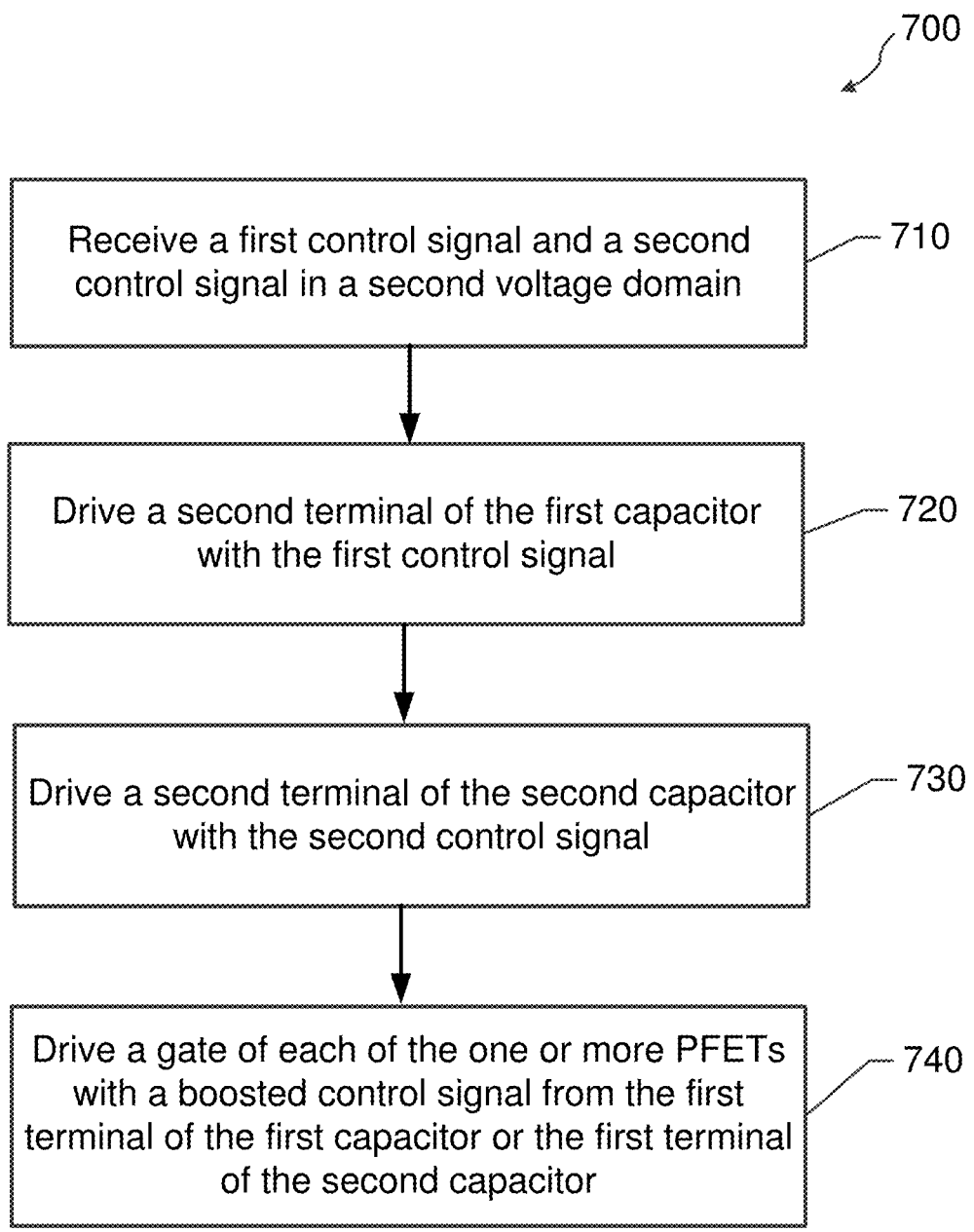
FIG. 7 is a flowchart illustrating a method for operating a system according to certain aspects of the present disclosure.

FIG. 7 shows an exemplary method 700 for operating a system. The system includes first p-type field effect transistor (PFET) (e.g., the first PFET 340), a second PFET (e.g., the second PFET 345), a first capacitor (e.g., the first capacitor 350), and a second capacitor (e.g., the second capacitor 360). A drain of the first PFET and a drain of the second PFET are coupled to a supply rail in a first voltage domain, a gate of the first PFET is coupled to a source of the second PFET, a gate of the second PFET is coupled to a source of the first PFET, a first terminal of the first capacitor is coupled to the source of the first PFET, and a first terminal of the second capacitor is coupled to the source of the second PFET.

At block 710, a first control signal and a second control signal in a second voltage domain are received. For example, the first control signal may correspond to the control signal phib and the second control signal may correspond to the control signal phi, or vice versa.

At block 720, a second terminal of the first capacitor is driven with the first control signal. For example, the control signal generator 272 may drive the second terminal of the first capacitor with the first control signal.

At block 720, a second terminal of the second capacitor is driven with the second control signal. For example, the control signal generator 272 may drive the second terminal of the second capacitor with the second control signal.

A gate of each of one or more PFETs is driven with a boosted control signal from the first terminal of the first capacitor or the first terminal of the second capacitor. For example, the one or more PFETs may correspond to one or more of the transistors 218 and 327.

In certain aspects, the first voltage domain has a first supply voltage (e.g., Vdd), the second voltage domain has a second supply voltage (e.g., Vdd0), and the first supply voltage is higher than the second supply voltage.

In certain aspects, each of the first control signal and the second control signal swings between a ground potential and the second supply voltage.

In certain aspects, the system includes a swing circuit (e.g., swing circuit 320). The swing circuit includes a first transistor (e.g., transistor 325) and a second transistor (e.g., transistor 327), a source of the first transistor is coupled to a ground, a source of the second transistor is coupled to the supply rail, and a drain of the first transistor and a drain of the second transistor are coupled to an output of the swing circuit. In these aspects, the method 700 may further include driving a gate of the first transistor with the first control signal or the second control signal (e.g., control signal phi or phib), and driving a gate of the second transistor with the boosted control signal (e.g., boosted control signal phi_bst or phib_bst). In certain aspects, the one or more PFETs include the second transistor.

In certain aspects, the first control signal and the second control signal have non-overlapping low phases.

In certain aspects, a source of each of the one or more PFETs is coupled to the supply rail in the first voltage domain.

In certain aspects, the one or more PFETs are in a bootstrap circuit (e.g., bootstrap circuit 120).

In certain aspects, the method 700 further includes generating the first control signal and the second control signal based on a clock signal. For example, the control signal generator 272 may generate the first control signal and the second control signal based on the clock signal (e.g., clock signal CLK).

Implementation examples are described in the following numbered clauses:

1. A system, comprising:
    a boost circuit, comprising:
        a first p-type field effect transistor (PFET), wherein a drain of the first PFET is coupled to a supply rail in a first voltage domain;
        a second PFET, wherein a drain of the second PFET is coupled to the supply rail in the first voltage domain, a gate of the second PFET is coupled to a source of the first PFET, and a gate of the first PFET is coupled to a source of the second PFET;
        a first capacitor, wherein a first terminal of the first capacitor is coupled to the source of the first PFET; and
        a second capacitor, wherein a first terminal of the second capacitor is coupled to the source of the second PFET;
    a control signal generator powered in a second voltage domain, wherein the control signal generator is configured to generate a first control signal and a second control signal, output the first control signal to a second terminal of the first capacitor, and output the second control signal to a second terminal of the second capacitor; and
    one or more PFETs, wherein a gate of each of the one or more PFETs is coupled to the first terminal of the first capacitor or the first terminal of the second capacitor.

2. The system of clause 1, wherein a source of each of the one or more PFETs is coupled to the supply rail in the first voltage domain.

3. The system of clause 1 or 2, wherein the first voltage domain has a first supply voltage, the second voltage domain has a second supply voltage, and the first supply voltage is higher than the second supply voltage.

4. The system of clause 3, wherein each of the first control signal and the second control signal swings between a ground potential and the second supply voltage.

5. The system of clause 4, wherein the control signal generator is configured to generate the first control signal and the second control signal based on a clock signal, and the clock signal swings between the ground potential and the second supply voltage.

6. The system of clause 5, wherein each of the first control signal and the second control signal has approximately a same frequency as the clock signal.

7. The system of any one of clauses 1 to 6, wherein the first control signal and the second control signal have non-overlapping low phases.

8. The system of any one of clauses 1 to 7, wherein the one or more PFETs are in a bootstrap circuit.

9. The system of clause 8, wherein the system further comprises a switch transistor coupled to the bootstrap circuit.

10. The system of clause 9, further comprising:
    a buffer; and
    a sampling capacitor, wherein the switch transistor is coupled between the buffer and the sampling capacitor.

11. The system of clause 10, further comprising an analog-to-digital converter (ADC) coupled to the sampling capacitor.

12. The system of any one of clauses 1 to 11, further comprising a swing circuit, wherein the swing circuit comprises:
    a first transistor, wherein a source of the first transistor is coupled to a ground, a gate of the first transistor is driven by the first control signal, and a drain of the first transistor is coupled to an output of the swing circuit; and
    a second transistor, wherein a source of the second transistor is coupled to the supply rail in the first voltage domain, the gate of the second transistor is coupled to the first terminal of the first capacitor or the first terminal of the second capacitor, and a drain of the second transistor is coupled to the output of the swing circuit.

13. The system of clause 12, further comprising one or more switches, wherein a control input of each of the one or more switches is coupled to the output of the swing circuit.

14. The system of clause 13, wherein the one or more PFETs and the one or more switches are in a bootstrap circuit.

15. The system of clause 13 or 14, wherein the one or more switches comprises at least one n-type field effect transistor (NFET).

16. The system of any one of clauses 12 to 15, wherein the first transistor comprises a pull-down n-type field effect transistor (NFET), and the second transistor comprises a pull-up PFET.

17. A method for operating a system, wherein the system includes a first p-type field effect transistor (PFET), a second PFET, a first capacitor, and a second capacitor, wherein a drain of the first PFET and a drain of the second PFET are coupled to a supply rail in a first voltage domain, a gate of the first PFET is coupled to a source of the second PFET, a gate of the second PFET is coupled to a source of the first PFET, a first terminal of the first capacitor is coupled to the source of the first PFET, and a first terminal of the second capacitor is coupled to the source of the second PFET, the method comprising:
  receiving a first control signal and a second control signal in a second voltage domain;
  driving a second terminal of the first capacitor with the first control signal;
  driving a second terminal of the second capacitor with the second control signal; and
  driving a gate of each of one or more PFETs with a boosted control signal from the first terminal of the first capacitor or the first terminal of the second capacitor.

18. The method of clause 17, wherein the first voltage domain has a first supply voltage, the second voltage domain has a second supply voltage, and the first supply voltage is higher than the second supply voltage.

19. The method of clause 18, wherein each of the first control signal and the second control signal swings between a ground potential and the second supply voltage.

20. The method of any one of clauses 17 to 19, wherein the system includes a swing circuit, the swing circuit includes a first transistor and a second transistor, a source of the first transistor is coupled to a ground, a source of the second transistor is coupled to the supply rail, and a drain of the first transistor and a drain of the second transistor are coupled to an output of the swing circuit, and wherein the method further comprising:
  driving a gate of the first transistor with the first control signal or the second control signal; and
  driving a gate of the second transistor with the boosted control signal.

21. The method of any one of clauses 17 to 20, wherein the first control signal and the second control signal have non-overlapping low phases.

22. The method of any one of clauses 17 to 21, wherein a source of each of the one or more PFETs is coupled to the supply rail in the first voltage domain.

23. The method of any one of clauses 17 to 22, wherein the one or more PFETs are in a bootstrap circuit.

24. The method of any one of clauses 17 to 23, further comprising generating the first control signal and the second control signal based on a clock signal.

25. The method of clause 24, wherein the first voltage domain has a first supply voltage, the second voltage domain has a second supply voltage, and the first supply voltage is higher than the second supply voltage.

26. The method of clause 25, wherein each of the first control signal, the second control signal, and the clock signal swings between a ground potential and the second supply voltage.

27. The method of any one of clauses 24 to 26, wherein each of the first control signal and the second control signal has approximately a same frequency as the clock signal.

28. The method of clause 27, wherein the first control signal and the second control signal have non-overlapping low phases.

It is to be appreciated that a transistor may be physically implemented on a chip using two or more transistors arranged in parallel in which the gates of the two or more transistors are coupled together. It is also to be appreciated that a logic gate may be physically implemented with two or more logic gates (e.g., combinational logic) that are coupled to perform the function of the logic gate.

Within the present disclosure, the word "exemplary" is used to mean "serving" as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. As used herein, "approximately" means within 10 percent of a stated value (i.e., between 90 percent of the stated value and 110 of the stated value).

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
  a boost circuit, comprising:
    a first p-type field effect transistor (PFET), wherein a drain of the first PFET is coupled to a supply rail in a first voltage domain;
    a second PFET, wherein a drain of the second PFET is coupled to the supply rail in the first voltage domain, a gate of the second PFET is coupled to a source of the first PFET, and a gate of the first PFET is coupled to a source of the second PFET;
    a first capacitor, wherein a first terminal of the first capacitor is coupled to the source of the first PFET; and
    a second capacitor, wherein a first terminal of the second capacitor is coupled to the source of the second PFET;
  a control signal generator powered in a second voltage domain, wherein the control signal generator is configured to generate a first control signal and a second control signal, output the first control signal to a second terminal of the first capacitor, and output the second control signal to a second terminal of the second capacitor;
  one or more PFETs, wherein a gate of each of the one or more PFETs is coupled to the first terminal of the first capacitor or the first terminal of the second capacitor, and the one or more PFETs are in a bootstrap circuit;
a switch transistor coupled to the bootstrap circuit;
a buffer; and
a sampling capacitor, wherein the switch transistor is coupled between the buffer and the sampling capacitor.

2. The system of claim 1, wherein a source of each of the one or more PFETs is coupled to the supply rail in the first voltage domain.

3. The system of claim 1, wherein the first voltage domain has a first supply voltage, the second voltage domain has a second supply voltage, and the first supply voltage is higher than the second supply voltage.

4. The system of claim 3, wherein each of the first control signal and the second control signal swings between a ground potential and the second supply voltage.

5. The system of claim 4, wherein the control signal generator is configured to generate the first control signal and the second control signal based on a clock signal, and the clock signal swings between the ground potential and the second supply voltage.

6. The system of claim 5, wherein each of the first control signal and the second control signal has approximately a same frequency as the clock signal.

7. The system of claim 1, wherein the first control signal and the second control signal have non-overlapping low phases.

8. The system of claim 1, further comprising an analog-to-digital converter (ADC) coupled to the sampling capacitor.

9. A system, comprising
a boost circuit, comprising
a first p-type field effect transistor (PFET), wherein a drain of the first PFET is coupled to a supply rail in a first voltage domain;
a second PFET, wherein a drain of the second PFET is coupled to the supply rail in the first voltage domain, a gate of the second PFET is coupled to a source of the first PFET, and a gate of the first PFET is coupled to a source of the second PFET;
a first capacitor, wherein a first terminal of the first capacitor is coupled to the source of the first PFET; and
a second capacitor, wherein a first terminal of the second capacitor is coupled to the source of the second PFET;
a control signal generator powered in a second voltage domain, wherein the control signal generator is configured to generate a first control signal and a second control signal, output the first control signal to a second terminal of the first capacitor, and output the second control signal to a second terminal of the second capacitor;
one or more PFETs, wherein a gate of each of the one or more PFETs is coupled to the first terminal of the first capacitor or the first terminal of the second capacitor; and
a swing circuit, wherein the swing circuit comprises:
a first transistor, wherein a source of the first transistor is coupled to a ground, a gate of the first transistor is driven by the first control signal, and a drain of the first transistor is coupled to an output of the swing circuit; and
a second transistor, wherein a source of the second transistor is coupled to the supply rail in the first voltage domain, the gate of the second transistor is coupled to the first terminal of the first capacitor or the first terminal of the second capacitor, and a drain of the second transistor is coupled to the output of the swing circuit.

10. The system of claim 9, further comprising one or more switches, wherein a control input of each of the one or more switches is coupled to the output of the swing circuit.

11. The system of claim 10, wherein the one or more PFETs and the one or more switches are in a bootstrap circuit.

12. The system of claim 10, wherein the one or more switches comprises at least one n-type field effect transistor (NFET).

13. The system of claim 9, wherein the first transistor comprises a pull-down n-type field effect transistor (NFET), and the second transistor comprises a pull-up PFET.

14. A method for operating a system, wherein the system includes a first p-type field effect transistor (PFET), a second PFET, a first capacitor, and a second capacitor, wherein a drain of the first PFET and a drain of the second PFET are coupled to a supply rail in a first voltage domain, a gate of the first PFET is coupled to a source of the second PFET, a gate of the second PFET is coupled to a source of the first PFET, a first terminal of the first capacitor is coupled to the source of the first PFET, and a first terminal of the second capacitor is coupled to the source of the second PFET, the method comprising:
receiving a first control signal and a second control signal in a second voltage domain;
driving a second terminal of the first capacitor with the first control signal;
driving a second terminal of the second capacitor with the second control signal; and
driving a gate of each of one or more PFETs with a boosted control signal from the first terminal of the first capacitor or the first terminal of the second capacitor,
wherein the system includes a swing circuit, the swing circuit includes a first transistor and a second transistor, a source of the first transistor is coupled to a ground, a source of the second transistor is coupled to the supply rail, and a drain of the first transistor and a drain of the second transistor are coupled to an output of the swing circuit, and wherein the method further comprising
driving a gate of the first transistor with the first control signal or the second control signal; and
driving a gate of the second transistor with the boosted control signal.

15. The method of claim 14, wherein the first voltage domain has a first supply voltage, the second voltage domain has a second supply voltage, and the first supply voltage is higher than the second supply voltage.

16. The method of claim 15, wherein each of the first control signal and the second control signal swings between a ground potential and the second supply voltage.

* * * * *